US011777526B2

(12) United States Patent
Xu et al.

(10) Patent No.: US 11,777,526 B2
(45) Date of Patent: Oct. 3, 2023

(54) EFFICIENT CONTROL CHANNEL DESIGN USING POLAR CODES

(71) Applicant: QUALCOMM Incorporated, San Diego, CA (US)

(72) Inventors: Changlong Xu, Beijing (CN); Chao Wei, Beijing (CN); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/332,847

(22) Filed: May 27, 2021

(65) Prior Publication Data

US 2021/0288668 A1  Sep. 16, 2021

Related U.S. Application Data

(63) Continuation of application No. 16/466,270, filed as application No. PCT/CN2017/087899 on Jun. 12, (Continued)

(51) Int. Cl.
*H03M 13/00* (2006.01)
*H03M 13/13* (2006.01)
*H03M 13/09* (2006.01)

(52) U.S. Cl.
CPC .......... *H03M 13/13* (2013.01); *H03M 13/09* (2013.01)

(58) Field of Classification Search
None
See application file for complete search history.

(56) References Cited

U.S. PATENT DOCUMENTS 5,844,918 A    12/1998  Kato
7,508,804 B2 *  3/2009  Das ..................... H04W 52/286
                                                      370/335
(Continued)

FOREIGN PATENT DOCUMENTS

CN    101321034 A   12/2008
CN    103069763 A    4/2013
(Continued)

OTHER PUBLICATIONS

Chiu M.C., et al., "Reduced-Complexity SCL Decoding of Multi-CRC-Aided Polar Codes", Sep. 28, 2016, XP055384603, pp. 1-9, Retrieved from the Internet: URL:https://arxiv.org/pdf/1609.08813.pdf [retrieved on Jun. 23, 2017].
(Continued)

*Primary Examiner* — Mujtaba M Chaudry
(74) *Attorney, Agent, or Firm* — Sevan Savsa; Loza & Loza, LLP

(57) ABSTRACT

Aspects of the disclosure relate to wireless communication systems configured to provide techniques for multiplexing dedicated control information for a plurality of users in a single information block and polar coding the information block to produce a polar code block of dedicated control information for transmission over a wireless air interface. The information block may further include group cyclic redundancy check (CRC) information for the information block and individual CRC information for each dedicated control information.

20 Claims, 18 Drawing Sheets

Related U.S. Application Data 2017, now Pat. No. 11,082,066, which is a continuation of application No. PCT/CN2016/108808, filed on Dec. 7, 2016.

(56) References Cited

U.S. PATENT DOCUMENTS

| | | | |
|---|---|---|---|
| 8,634,366 B2 | 1/2014 | Kim et al. | |
| 8,862,958 B2 | 10/2014 | Pi et al. | |
| 2006/0069980 A1 | 3/2006 | Tzannes | |
| 2014/0173376 A1 | 6/2014 | Jeong et al. | |
| 2014/0365842 A1 | 12/2014 | Li et al. | |
| 2015/0026543 A1 | 1/2015 | Li et al. | |
| 2016/0013810 A1 | 1/2016 | Gross et al. | |
| 2016/0182187 A1 | 6/2016 | Kim et al. | |
| 2017/0230059 A1 | 8/2017 | Giard et al. | |
| 2017/0366199 A1 | 12/2017 | Ge et al. | |
| 2019/0190655 A1* | 6/2019 | Pan | H04L 1/0088 |
| 2020/0067530 A1 | 2/2020 | Xu et al. | |
| 2020/0145092 A1* | 5/2020 | Jung | H04B 7/0413 |
| 2020/0252080 A1* | 8/2020 | Lam | H03M 13/112 |
| 2021/0306005 A1* | 9/2021 | Sheiman | H03M 13/6575 |

FOREIGN PATENT DOCUMENTS

| | | |
|---|---|---|
| CN | 103368583 A | 10/2013 |
| CN | 104219019 A | 12/2014 |
| CN | 105227189 A | 1/2016 |
| EP | 1351538 A1 | 10/2003 |
| EP | 2824841 A1 | 1/2015 |
| WO | 2014190915 A1 | 12/2014 |

OTHER PUBLICATIONS

Guo J., et al., "Multi-CRC Polar Codes and Their Applications", IEEE Communications Letters, IEEE Service Center, Piscataway, NJ, US, vol. 20, No. 2, Feb. 1, 2016 (Feb. 1, 2016), XP011598246, pp. 212-215, ISSN: 1089-7798, DOI:10.1109/LCOMM.2015.2508022, [retrieved on Feb. 8, 2016], Abstract, Sections II, III, IV.
International Preliminary Report on Patentability—PCT/CN2016/108808, The International Bureau of WIPO—Geneva, Switzerland, dated Jun. 20, 2019.
International Preliminary Report on Patentability—PCT/CN2017/087899, The International Bureau of WIPO—Geneva, Switzerland, dated Apr. 11, 2019.
International Search Report and Written Opinion—PCT/CN2016/108808—ISA/EPO—dated Jul. 11, 2017.
International Search Report and Written Opinion—PCT/CN2017/087899—ISA/EPO—dated Aug. 25, 2017.
Mediatek Inc: "CRC Considerations for Polar Coded NR Control Channels", 3GPP Draft, 3GPP TSG RAN WG1 RAN1 #88 Meeting, R1-1702736 CRC Considerations for Polar Coded NR Control Channels Final, 3rd Generation Partnership Project (3GPP), Mobile Competence Centre, 650, Route Des Lucioles, F-06921 Sophia-Anti, vol. RAN WG1, No. Athens, Greece, Feb. 13, 2017-Feb. 17, 2017 Feb. 7, 2017 (Feb. 7, 2017), XP051221576, 6 Pages, Retrieved from the Internet: URL:http://www.3gpp.org/ftp/tsg_ran/WG1_RL1/TSGR1_/Docs/ [retrieved on Feb. 7, 2017].
Supplementary European Search Report—EP17878587—Search Authority—Munich—dated Jul. 9, 2020.
European Search Report—EP23156219—Search Authority—Munich—dated Jun. 6, 2023.

* cited by examiner

| Type | Aggregation Level | Size (in CCEs) | Candidates |
|---|---|---|---|
| UE-specific | 1 | 6 | 6 |
| | 2 | 12 | 6 |
| | 4 | 8 | 2 |
| | 8 | 16 | 2 |
| Common | 4 | 16 | 4 |
| | 8 | 16 | 2 |

FIG. 4

EFFICIENT CONTROL CHANNEL DESIGN USING POLAR CODES

CROSS-REFERENCE TO RELATED APPLICATIONS

The present Application for patent is a Continuation of Non-Provisional application Ser. No. 16/466,270 filed in the U.S. Patent and Trademark Office on Jun. 3, 2019, the entire content of which is incorporated herein by reference as if fully set forth below in its entirety and for all applicable purposes. Non-Provisional application Ser. No. 16/466,270 is the U.S. national stage of PCT patent application number PCT/CN2017/087899 filed on Jun. 12, 2017, the content of which is incorporated herein by reference as if fully set forth below in its entirety and for all applicable purposes. PCT patent application number PCT/CN2017/087899 claims priority to and the benefit of PCT patent application number PCT/CN2016/108808 filed on Dec. 7, 2016, the content of which is incorporated herein by reference as if fully set forth below in its entirety and for all applicable purposes.

TECHNICAL FIELD

The technology discussed below relates generally to wireless communication systems, and more particularly, to a control channel design using polar codes. Embodiments can provide techniques for polar coding dedicated control information for multiple users in a wireless transmission.

INTRODUCTION

Block codes, or error correcting codes, are frequently used to provide reliable transmission of digital messages over noisy channels. In a typical block code, an information sequence is split up into blocks, and an encoder at the transmitting device then mathematically adds redundancy to the information sequence. Exploitation of this redundancy in the encoded information sequence is the key to the reliability of the sequence, enabling correction for any bit errors that may occur due to the noise. That is, a decoder at the receiving device can take advantage of the redundancy to reliably recover the information sequence even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

While research into implementation of polar codes continues to rapidly advance its capabilities and potential, additional enhancements are desired, particularly for potential deployment of future wireless communication networks beyond LTE.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide for polar coding dedicated control information for multiple users in a wireless transmission. By multiplexing dedicated control information for a plurality of users into a single transmission, a larger code block size may be achieved, thus improving the error correcting performance of polar coding. Further, the dedicated control information for each of the users included within a polar code block may have the same size to enable the receiver to polar decode and efficiently locate its dedicated control information. In some aspects of the disclosure, a group cyclic redundancy check (CRC) is provided for the polar code block, while each dedicated control information within the polar code block includes only a short cyclic redundancy check (CRC) to reduce the CRC overhead.

In one aspect of the disclosure, a method of wireless communication is provided. The method includes generating an information block including dedicated control information for each of a plurality of scheduled entities, where each of the dedicated control information is a same size. The method further includes generating individual cyclic redundancy check (CRC) information for each of the respective dedicated control information, generating group CRC information for the information block, encoding the information block, including the individual CRC information and the group CRC information, utilizing polar coding to generate a polar code block, and transmitting the polar code block over a wireless air interface.

Another aspect of the disclosure provides an apparatus configured for polar coding. The apparatus includes a transceiver, a memory, and a processor communicatively coupled to the transceiver and the memory. The processor is configured to generate an information block including dedicated control information for each of a plurality of scheduled entities, where each of the dedicated control information is a same size. The processor is further configured to generate individual cyclic redundancy check (CRC) information for each of the respective dedicated control information, generate group CRC information for the information block, encode the information block, including the individual CRC information and the group CRC information, utilizing polar coding to generate a polar code block, and transmit the polar code block over a wireless air interface.

Examples of additional aspects of the disclosure follow. In some aspects of the present disclosure, each individual CRC information may be generated based on the respective dedicated control information and a respective connection identifier (CID) of the scheduled entity. In some examples, each individual CRC includes five bits masked with the respective CID. In some examples, the group CRC may include sixteen bits, twenty-four bits, or thirty-two bits.

In some aspects of the present disclosure, the dedicated control information may be grouped within the information block into control information groups in accordance with channel conditions associated with each of the scheduled entities. In some aspects of the disclosure, respective group CRC information may be generated for each of the control information groups.

In some examples, the information block includes a plurality of original bit locations and the polar code block includes a plurality of coded bit locations, where each of the coded bit locations corresponds to a sub-channel. The dedicated control information may be grouped into the control information blocks by determining a reliability metric for each of the original bit locations, sorting the sub-channels based on the reliability metrics into the control information groups, and placing each of the dedicated control information within one of the control information groups based on the channel conditions and the reliability metrics. For example, the channel conditions of the scheduled entities may be sorted in order from worst channel conditions to best channel conditions to produce a channel condition order, and each of the dedicated control information may be placed within one of the control information groups in order from a highest reliability group to a lowest reliability group utilizing the channel condition order. In this example, the dedicated control information for the scheduled entities having the worst channel conditions may be allocated to the highest reliability group and the dedicated control information for the scheduled entities having the best channel conditions may be allocated to the lowest reliability group. In addition, each of the reliability metrics for the sub-channels within the highest reliability group are higher than the reliability metrics for the sub-channels within the lowest reliability group.

In some aspects of the disclosure, the information block may be generated by determining a reliability metric for each of the original bit locations of the information block. Sub-channels may then be allocated to the dedicated control information based on the reliability metrics and the channel conditions associated with each of the plurality of scheduled entities. For example, the channel conditions of the scheduled entities may be sorted in order from worst channel conditions to best channel conditions to produce a channel condition order, and the sub-channels may be allocated to the dedicated control information in order from a highest reliability sub-channel to a lowest reliability sub-channel utilizing the channel condition order. In this example, the dedicated control information for a worst scheduled entity of the plurality of scheduled entities having the worst channel conditions is allocated to the highest reliability sub-channel and the dedicated control information for a best scheduled entity of the plurality of scheduled entities having the best channel conditions is allocated to the lowest reliability sub-channel.

In some aspects of the disclosure, an information message including a number of the plurality of scheduled entities having the dedicated control information within the information block may be generated and encoded to produce an encoded information message. The encoded information message may then be transmitted over the wireless air interface. In some examples, the information message includes five bits.

In another aspect of the disclosure, a method of wireless communication operable at a scheduled entity is provided. The method includes receiving a polar code block including multiplexed control information for a plurality of scheduled entities, including the scheduled entity. The method further includes decoding the polar code block utilizing polar decoding, locating dedicated control information for the scheduled entity from within the multiplexed control information, and verifying integrity of the dedicated control information.

Another aspect of the disclosure provides an apparatus configured for polar decoding. The apparatus includes a processor, a memory communicatively coupled to the processor, and a transceiver communicatively coupled to the processor. The processor is configured to receive a polar code block including multiplexed control information for a plurality of scheduled entities, including the scheduled entity. The processor is further configured to decode the polar code block utilizing polar decoding, locate dedicated control information for the scheduled entity from within the multiplexed control information, and verify integrity of the dedicated control information.

Examples of additional aspects of the disclosure follow. In some aspects of the present disclosure, the scheduled entity may further verify the integrity of the multiplexed control information. In some aspects of the present disclosure, the scheduled entity may further perform successive-cancellation list decoding of the polar code block utilizing group CRC information for the multiplexed control information included within the polar code block.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 4 is a table illustrating exemplary formats for the Physical Downlink Control Channel (PDCCH).

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Radio Access Network

Figure 1:
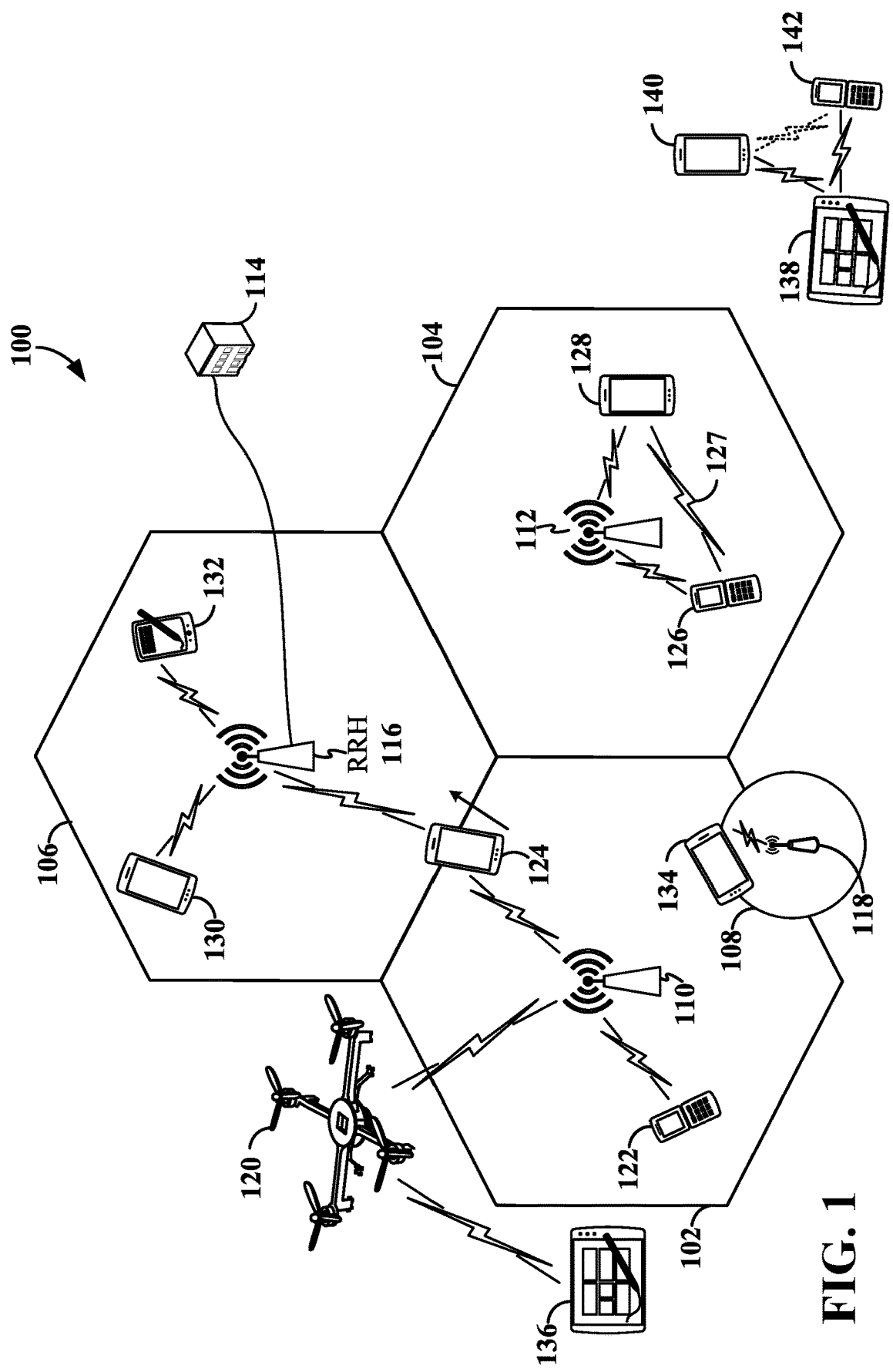
FIG. 1 is a conceptual diagram illustrating an example of a radio access network.

The various concepts presented throughout this disclosure may be implemented across a broad variety of telecommunication systems, network architectures, and communication standards. Referring now to FIG. 1, as an illustrative example without limitation, a schematic illustration of a radio access network 100 is provided. The access network 100 may be a next generation (e.g., fifth generation (5G)) access network or a legacy (e.g., 3G or 4G) access network. In addition, one or more nodes in the access network 100 may be next generation nodes or legacy nodes.

As used herein, the term legacy access network refers to a network employing a third generation (3G) wireless communication technology based on a set of standards that complies with the International Mobile Telecommunications-2000 (IMT-2000) specifications or a fourth generation (4G) wireless communication technology based on a set of standards that comply with the International Mobile Telecommunications Advanced (ITU-Advanced) specification. For example, some the standards promulgated by the 3rd Generation Partnership Project (3GPP) and the 3rd Generation Partnership Project 2 (3GPP2) may comply with IMT-2000 and/or ITU-Advanced. Examples of such legacy standards defined by the 3rd Generation Partnership Project (3GPP) include, but are not limited to, Long-Term Evolution (LTE), LTE-Advanced, Evolved Packet System (EPS), and Universal Mobile Telecommunication System (UMTS). Additional examples of various radio access technologies based on one or more of the above-listed 3GPP standards include, but are not limited to, Universal Terrestrial Radio Access (UTRA), Evolved Universal Terrestrial Radio Access (eUTRA), General Packet Radio Service (GPRS) and Enhanced Data Rates for GSM Evolution (EDGE). Examples of such legacy standards defined by the 3rd Generation Partnership Project 2 (3GPP2) include, but are not limited to, CDMA2000 and Ultra Mobile Broadband (UMB). Other examples of standards employing 3G/4G wireless communication technology include the IEEE 802.16 (WiMAX) standard and other suitable standards.

As further used herein, the term next generation access network generally refers to a network employing continued evolved wireless communication technologies. This may include, for example, a fifth generation (5G) wireless communication technology based on a set of standards. The standards may comply with the guidelines set forth in the 5G White Paper published by the Next Generation Mobile Networks (NGMN) Alliance on Feb. 17, 2015. For example, standards that may be defined by the 3GPP following LTE-Advanced or by the 3GPP2 following CDMA2000 may comply with the NGMN Alliance 5G White Paper. Standards may also include pre-3GPP efforts specified by Verizon Technical Forum (www.vstgf) and Korea Telecom SIG (www.kt5g.org).

The geographic region covered by the access network 100 may be divided into a number of cellular regions (cells) that can be uniquely identified by a user equipment (UE) based on an identification broadcasted over a geographical from one access point or base station. FIG. 1 illustrates macrocells 102, 104, and 106, and a small cell 108, each of which may include one or more sectors. A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a GNodeB or some other suitable terminology.

In FIG. 1, two high-power base stations 110 and 112 are shown in cells 102 and 104; and a third high-power base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the high-power base stations 110, 112, and 114 support cells having a large size. Further, a low-power base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the low-power base station 118 supports a cell having a relatively small size. Cell sizing can be done according to system design as well as component constraints. It is to be understood that the access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion of the network. The backhaul may provide a link between a base station and a core network, and in some examples, the backhaul may provide interconnection between the respective base stations. The core network is a part of a wireless communication system that is generally independent of the radio access technology used in the radio access network. Various types of backhaul interfaces may be employed, such as a direct physical connection, a virtual network, or the like using any suitable transport network. Some base stations may be configured as integrated access and backhaul (IAB) nodes, where the wireless spectrum may be used both for access links (i.e., wireless links with UEs), and for backhaul links. This scheme is sometimes referred to as wireless self-backhauling. By using wireless self-backhauling, rather than requiring each new base station deployment to be outfitted with its own hard-wired backhaul connection, the wireless spectrum utilized for communication between the base station and UE may be leveraged for backhaul communication, enabling fast and easy deployment of highly dense small cell networks.

The access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service user data traffic, and/or relevant QoS for transport of critical service user data traffic.

Within the access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with low-power base station 118; and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., quadcopter 120) may be configured to function as a UE. For example, the quadcopter 120 may operate within cell 102 by communicating with base station 110. In some aspects of the disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or user data traffic from a base station (e.g., base station 110) to one or more UEs (e.g., UEs 122 and 124) may be referred to as downlink (DL) transmission, while transmissions of control information and/or user data traffic originating at a UE (e.g., UE 122) may be referred to as uplink (UL) transmissions. In addition, the uplink and/or downlink control information and/or traffic information may be time-divided into frames, subframes, slots, mini-slots and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A mini-slot may carry less than 7 OFDM symbols or less than 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

The air interface in the access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), single-carrier frequency division multiple access (SC-FDMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), single-carrier frequency division multiplexing (SC-FDM) or other suitable multiplexing schemes.

Further, the air interface in the access network 100 may utilize one or more duplexing algorithms Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of a mobility management entity (MME). In various aspects of the disclosure, an access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the access network 100. Each of the cells may measure a strength of the pilot signal, and the access network (e.g., one or more of the base stations 110 and 114/116 and/or a central node within the core network) may determine a serving cell for the UE 124. As the UE 124 moves through the access network 100, the network may continue to monitor the uplink pilot signal transmitted by the UE 124. When the signal strength or quality of the pilot signal measured by a neighboring cell exceeds that of the signal strength or quality measured by the serving cell, the network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

Signaling Entities

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
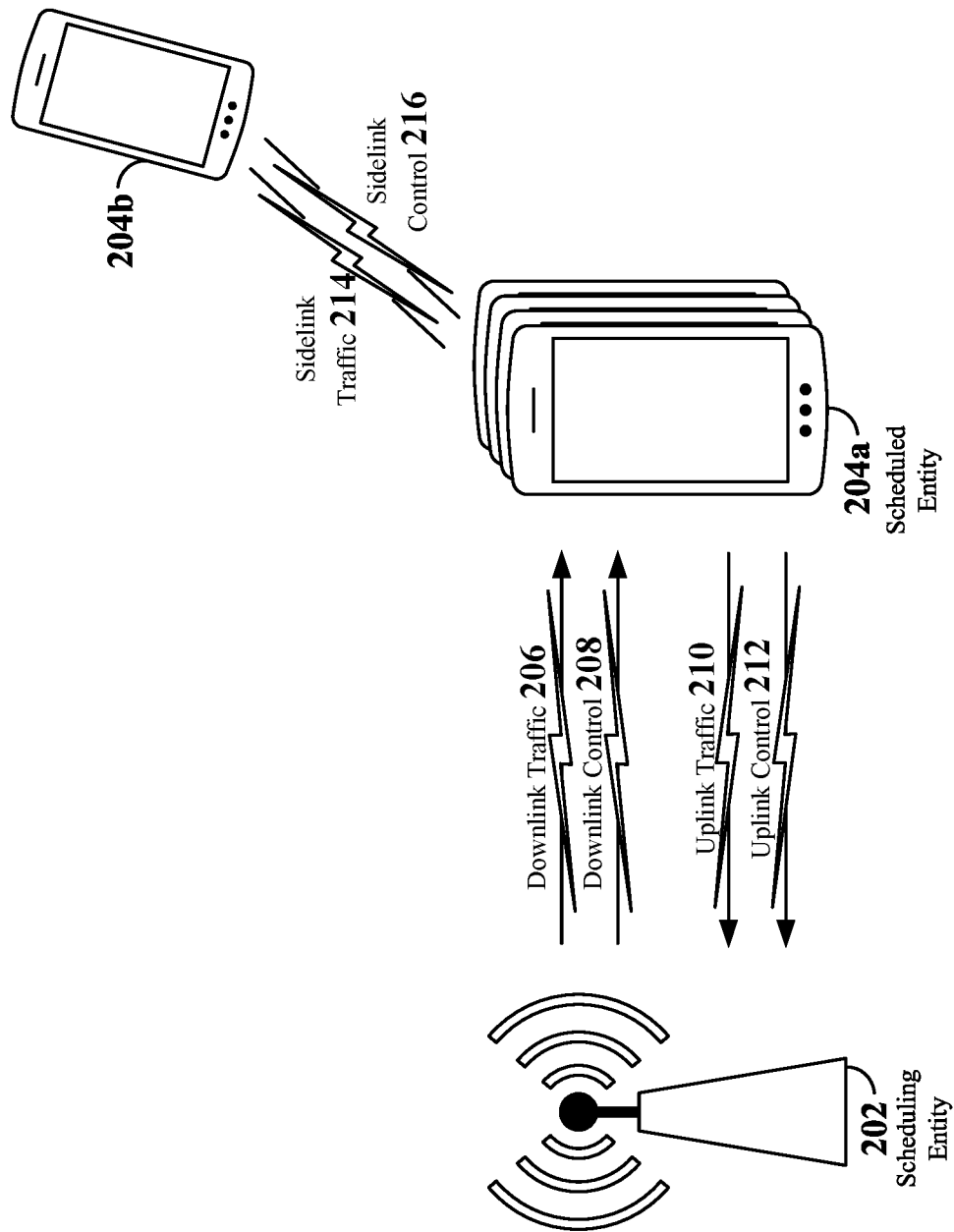
FIG. 2 is a block diagram conceptually illustrating an example of a scheduling entity communicating with one or more scheduled entities according to some embodiments.

Thus, in a wireless communication network with scheduled access to time-frequency resources and having a cellular configuration, a P2P configuration, or a mesh configuration, a scheduling entity and one or more scheduled entities may communicate utilizing the scheduled resources. Referring now to FIG. 2, a block diagram illustrates a scheduling entity 202 and a plurality of scheduled entities 204 (e.g., 204*a* and 204*b*). Here, the scheduling entity 202 may correspond to a base station 110, 112, 114, and/or 118. In additional examples, the scheduling entity 202 may correspond to a UE 138, the quadcopter 120, or any other suitable node in the radio access network 100. Similarly, in various examples, the scheduled entity 204 may correspond to the UE 122, 124, 126, 128, 130, 132, 134, 136, 138, 140, and 142, or any other suitable node in the radio access network 100.

As illustrated in FIG. 2, the scheduling entity 202 may broadcast user data traffic 206 to one or more scheduled entities 204 (the user data traffic may be referred to as downlink user data traffic). In accordance with certain aspects of the present disclosure, the term downlink may refer to a point-to-multipoint transmission originating at the scheduling entity 202. Broadly, the scheduling entity 202 is a node or device responsible for scheduling user data traffic in a wireless communication network, including the downlink transmissions and, in some examples, uplink user data traffic 210 from one or more scheduled entities to the scheduling entity 202. Another way to describe the system may be to use the term broadcast channel multiplexing. In accordance with aspects of the present disclosure, the term uplink may refer to a point-to-point transmission originating at a scheduled entity 204. Broadly, the scheduled entity 204 is a node or device that receives scheduling control information, including but not limited to scheduling grants, synchronization or timing information, or other control information from another entity in the wireless communication network such as the scheduling entity 202.

The scheduling entity 202 may broadcast control information 208 including one or more control channels, such as a PBCH; a PSS; a SSS; a physical control format indicator channel (PCFICH); a physical hybrid automatic repeat request (HARQ) indicator channel (PHICH); and/or a physical downlink control channel (PDCCH), etc., to one or more scheduled entities 204. The PHICH carries HARQ feedback transmissions such as an acknowledgment (ACK) or negative acknowledgment (NACK). HARQ is a technique well known to those of ordinary skill in the art, wherein packet transmissions may be checked at the receiving side for accuracy, and if confirmed, an ACK may be transmitted, whereas if not confirmed, a NACK may be transmitted. In response to a NACK, the transmitting device may send a HARQ retransmission, which may implement chase combining, incremental redundancy, etc.

Uplink user data traffic 210 and/or downlink user data traffic 206 including one or more traffic channels, such as a physical downlink shared channel (PDSCH) or a physical uplink shared channel (PUSCH) (and, in some examples, system information blocks (SIBs)), may additionally be transmitted between the scheduling entity 202 and the scheduled entity 204. Transmissions of the control and user data traffic information may be organized by subdividing a carrier, in time, into suitable slots.

Furthermore, the scheduled entities 204 may transmit uplink control information 212 including one or more uplink control channels to the scheduling entity 202. Uplink control information may include a variety of packet types and categories, including pilots, reference signals, and information configured to enable or assist in decoding uplink traffic transmissions. In some examples, the control information 212 may include a scheduling request (SR), i.e., request for the scheduling entity 202 to schedule uplink transmissions. Here, in response to the SR transmitted on the control channel 212, the scheduling entity 202 may transmit downlink control information 208 that may schedule the slot for uplink packet transmissions.

Uplink and downlink transmissions may generally utilize a suitable error correcting block code. In a typical block code, an information sequence is split up into information blocks, and an encoder at the transmitting device then mathematically adds redundancy to the information sequence. Exploitation of this redundancy in the encoded information sequence can improve the reliability of the sequence, enabling correction for any bit errors that may occur due to the noise. Some examples of error correcting codes include Hamming codes, Bose-Chaudhuri-Hocquenghem (BCH) codes, turbo codes, low-density parity check (LDPC) codes, Walsh codes, and polar codes. Various implementations of scheduling entities 202 and scheduled entities 204 may include suitable hardware and capabilities (e.g., an encoder and/or decoder) to utilize any one or more of these error correcting codes for wireless communication.

In some examples, scheduled entities such as a first scheduled entity 204*a* and a second scheduled entity 204*b* may utilize sidelink signals for direct D2D communication. Sidelink signals may include sidelink traffic 214 and sidelink control 216. Sidelink control information 216 may include a request-to-send (RTS) channel and a clear-to-send (CTS) channel. The RTS may provide for a scheduled entity 204 to request a duration of time to keep a sidelink channel available for a sidelink signal; and the CTS may provide for the scheduled entity 204 to indicate the availability of the sidelink channel, e.g., for a requested duration of time. An exchange of RTS and CTS signals (e.g., handshake) may enable different scheduled entities performing sidelink communications to negotiate the availability of the sidelink channel prior to communication of the sidelink traffic information 214.

The channels or carriers illustrated in FIG. 2 are not necessarily all of the channels or carriers that may be utilized between a scheduling entity 202 and scheduled entities 204, and those of ordinary skill in the art will recognize that other channels or carriers may be utilized in addition to those illustrated, such as other traffic, control, and feedback channels.

Resource Structure

Figure 3:
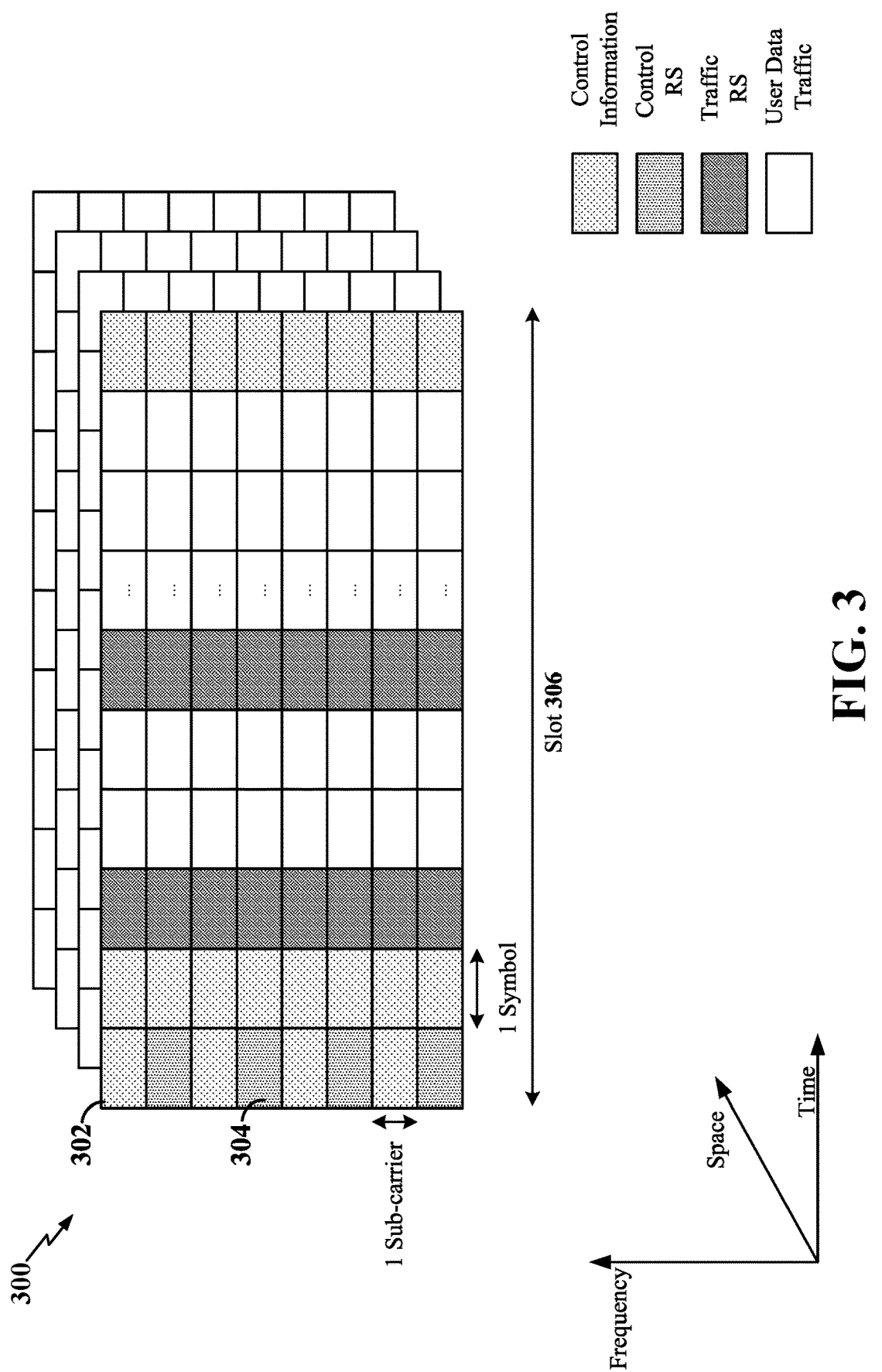
FIG. 3 is a schematic illustration of the resource structure for a radio access network showing time, frequency, and space dimensions

FIG. 3 is a schematic illustration of an exemplary resource structure 300 for a radio access network, such as the RAN 100 illustrated in FIG. 1. In some examples, this illustration may represent downlink or uplink wireless resources as they may be allocated in an OFDM system that utilizes multiple-input-multiple-output (MIMO). In some examples, in a 5G NR radio access network, it is anticipated that OFDM may be utilized for DL transmissions, UL transmissions (OFDMA), and/or sidelink transmissions. Furthermore, in a 5G NR radio access network, a waveform other than OFDM may be utilized for UL and/or sidelink transmissions, such as SC-FDMA or DFT-s-OFDMA. It should be further understood that various aspects of the present disclosure may be applied to an SC-FDMA or DFT-s-OFDMA waveform in substantially the same way as described herein below.

MIMO is a multi-antenna technology that exploits multipath signal propagation so that the information-carrying capacity of a wireless link can be multiplied by using multiple antennas at the transmitter and receiver to send multiple simultaneous streams. At the multi-antenna transmitter, a suitable precoding algorithm (scaling the respective streams' amplitude and phase) is applied (in some examples, based on known channel state information). At the multi-antenna receiver, the different spatial signatures of the respective streams (and, in some examples, known channel state information) can enable the separation of these streams from one another.

Massive MIMO is a MIMO system with a very large number of antennas (e.g., greater than an 8×8 array). Further, in a multi-user MIMO (MU-MIMO) system, a base station, in communication with a large number of UEs, can exploit multipath signal propagation to increase overall network capacity by increasing throughput and spectral efficiency, and reducing the required transmission energy.

Referring again to FIG. 3, the resources in a wireless channel may be characterized according to three dimensions: frequency, space, and time. The frequency and time dimensions of an OFDM system may be represented by a two-dimensional grid 302 of resource elements (REs) 304. The REs 304 are defined by the separation of frequency resources into closely spaced narrowband frequency tones or sub-carriers and the separation of time resources into a sequence of OFDM symbols having a given duration. In the example shown in FIG. 3, each RE 304 is represented by a rectangle having the dimensions of one sub-carrier (e.g., 15 kHz bandwidth) by one OFDM symbol. Thus, each RE 304 represents a sub-carrier modulated for the OFDM symbol period by one OFDM data symbol and contains a single complex value representing data from a physical channel or signal. Depending on the modulation utilized in a particular implementation, each RE may represent one or more bits of information. Each OFDM symbol may be modulated using, for example, quadrature phase shift keying (QPSK), 16 quadrature amplitude modulation (QAM) or 64 QAM. Further, by utilizing spatial multiplexing (e.g., with MIMO), a plurality of OFDM streams are represented by separate OFDM resource grids 302 spanning in the space dimension of FIG. 3.

The REs 304 may further be grouped into resource blocks (RB). Each RB may contain any suitable number of consecutive subcarriers in the frequency domain and, in some examples depending on the length of a cyclic prefix (CP) used in each OFDM symbol, any suitable number of consecutive OFDM symbols in the time domain. An RB may be the smallest unit of resources that can be allocated to a UE. Thus, the more RBs scheduled for a UE, and the higher the modulation scheme chosen for the air interface, the higher the data rate for the UE. For example, in LTE networks, an RB includes 12 consecutive sub-carriers in the frequency domain and, for a normal cyclic prefix in each OFDM symbol, 7 consecutive OFDM symbols in the time domain, or 84 resource elements. However, it should be understood that any suitable number of REs 304 may be grouped into a resource block.

In addition, any number of resource blocks (e.g., groups of sub-carriers and OFDM symbols) may be utilized within a slot or mini-slot. In the illustrated example shown in FIG. 3, the resource structure 300 represents a portion of a slot 306, which may be, for example, a downlink-centric slot or an uplink-centric slot. A DL-centric slot is referred to as a DL-centric slot because a majority (or, in some examples, a substantial portion) of the slot includes DL data. An UL-centric slot is referred to as a UL-centric slot because a majority (or, in some examples, a substantial portion) of the slot includes UL data.

In a given DL-centric or UL-centric slot 306, transmission of one or more downlink control channels may be followed by transmission of one or more downlink or uplink traffic channels, in the time dimension. In general, the first N OFDM symbols in a DL-centric or UL-centric slot typically correspond to a downlink control region (DL burst) of the slot that carries downlink control reference signals (Control RSs), such as the cell specific reference signal (C-RS) and channel state information reference signal (CSI-RS), which aid in downlink channel estimation, and downlink control information (Control Information), such as the Physical Control Format Indicator Channel (PCFICH), which carries the Control Format Indicator (CFI), the Physical Hybrid Automatic Repeat Request (HARQ) Indicator Channel (PHICH), and the Physical Downlink Control Channel (PDCCH), which carries Downlink Control Information (DCI).

In the non-limiting example illustrated in FIG. 3, the first two symbols include downlink control reference signals and downlink control information, which may be the same as the control information 208 and/or 216 described above. Accordingly, these symbols may be referred to as the DL burst. Any suitable region of resources in the time, frequency, and space dimensions may be utilized as a DL burst, not necessarily limited to the first two symbols. Moreover, a DL burst need not necessarily be contiguous, and may be included in one, two, or any suitable number of separate regions.

Following the DL burst, the slot 306 may include a traffic region carrying downlink or uplink traffic reference signals (Traffic RSs) and traffic (User Data Traffic), which may be the same as the user data traffic 206, 210, and/or 214 described above. Thus, within the traffic region, REs that carry reference signals (RS) may be interleaved with REs that carry user data traffic. For example, within the traffic region of an uplink-centric slot, one of the RSs may include a sounding reference signal (SRS). The SRS is transmitted from the scheduled entity to the scheduling entity to enable the scheduling entity to estimate the uplink channel quality. The SRS may further be utilized by the scheduling entity for uplink timing estimation.

In addition, one or more of the RSs in the traffic region of an uplink-centric slot or a downlink-centric slot may include a demodulation reference signal (DMRS), which may be used to enable coherent signal demodulation at the receiver. In some examples, the DMRS may be transmitted from a scheduled entity to a scheduling entity at the beginning of the traffic region in an UL-centric slot to enable the scheduling entity to demodulate the subsequently transmitted uplink user data traffic.

At the end of the traffic region, the slot 306 may include an uplink (UL) burst that carries uplink control information. For example, the uplink burst may include a physical uplink control channel (PUCCH), physical random access channel (PRACH) or other suitable uplink control information. In the non-limiting example illustrated in FIG. 3, the last symbol in the slot includes the uplink control information, which may be the same as the control information 212 and/or 216 described above. While the above description only refers to the front resource grid (i.e., not considering the space dimension), it is to be understood that control and traffic information for a plurality of users may be multiplexed in space, frequency, and time.

Physical Downlink Control Channel Format

FIG. 4 is a table 400 illustrating exemplary formats for the Physical Downlink Control Channel (PDCCH). The PDCCH is typically transmitted over an aggregation of contiguous control channel elements (CCEs) in the control region of the subframe. In some examples, one CCE includes nine continuous resource element groups (REGs), where each REG includes four resource elements (REs). Thus, one CCE may include thirty-six REs.

In some examples, the PDCCH may be constructed from a variable number of CCEs, depending on the PDCCH format (or aggregation level). Each PDCCH format (or aggregation level) supports a different DCI length. In the non-limiting example shown in FIG. 4, PDCCH aggregation levels of 1, 2, 4, and 8 are supported, corresponding to 1, 2, 4, and 8 contiguous CCEs, respectively. The aggregation level for a particular UE may be selected, for example, based on the channel conditions of that particular UE. In some examples, when the channel conditions are poor, a higher aggregation level may be used to provide redundancy of the control information. The channel conditions may be determined based on channel state information (CSI) (e.g., the channel quality indicator (CQI)), the signal-to-interference-noise ratio (SINR) or other channel measurements.

The DCI within the PDCCH provides downlink resource assignments and/or uplink resource grants for one or more scheduled entities. Multiple PDCCHs may be transmitted each subframe and each PDCCH may carry user-specific DCI or common DCI (e.g., control information broadcast to a group of scheduled entities). Each DCI may further include a cyclic redundancy check (CRC) code that is masked (scrambled) with a radio network temporary identifier (RNTI) or a short connection identifier (CID), which may be a specific user RNTI/CID or a group RNTI/CID, to allow the UE to verify the integrity of the received control information.

Since the UE is unaware of the particular aggregation level of the PDCCH or whether multiple PDCCHs may exist for the UE in the subframe or slot, the UE may perform blind decoding of various decoding candidates within the first N control OFDM symbols identified by the CFI of the PCFICH. Each decoding candidate includes a collection of one or more consecutive CCEs based on an assumed DCI length (e.g., PDCCH aggregation level). To limit the number of blind decodes, a UE-specific search space and a common search space may be defined. The search spaces limit the number of blind decodes that the UE performs for each PDCCH aggregation level. The common search space consists of CCEs used for sending common control information that is common to a group of UEs. Thus, the common search space is monitored by all UEs in a cell and is typically static between subframes. In some examples, the maximum number of CCEs within the common search space may be sixteen. In the example shown in FIG. 4, there are only two PDCCH aggregation levels supported in the common search space: 8 and 4. Therefore, within the first 16 CCEs, the UE may perform blind decoding of decoding candidates at aggregation level 8 (which results in two decodes in the common search space) and at aggregation level 4 (which results in four decodes in the common search space). If the UE successfully decodes a PDCCH in the common search space, those CCEs may be omitted from any overlapping UE-specific search space.

The UE-specific search space consists of CCEs used for sending dedicated control information for particular UEs. The starting point (offset or index) of a UE-specific search space may be different for each UE and each UE may have multiple UE-specific search spaces (e.g., one for each aggregation level). The maximum number of CCEs within a particular UE-specific search space for a specific UE may be variable dependent upon the PDCCH aggregation level. In the example shown in FIG. 4, the PDCCH aggregation level of 1 has a UE-specific search space of 6 CCEs, the PDCCH aggregation level of 2 has a UE-specific search space of 12 CCEs, the PDCCH aggregation level of 4 has a UE-specific search space of 8 CCEs and the PDCCH aggregation level of 8 has a UE-specific search space of 16 CCEs. Thus, for each of the PDCCH aggregation levels of 1 or 2, there are 6 PDCCH decoding candidates within the UE-specific search space. Similarly, for each of the PDCCH aggregation levels of 4 or 8, there are 2 PDCCH decoding candidates within the UE-specific search space. For example, for the PDCCH aggregation level of 1 with a UE-specific search space of 6 CCEs, each decoding candidate includes one of the CCEs within the UE-specific search space. As another example, for the PDCCH aggregation level of 4 with a UE-specific search space of 8, each decoding candidate includes 4 CCEs within the UE-specific search space (e.g., a first decoding candidate may include CCEs 0-3 and a second decoding candidate may include CCEs 4-7). The UE may perform blind decoding over all aggregation levels and corresponding UE-specific search spaces to determine whether at least one valid DCI exists for the UE within the UE-specific search space(s).

Control Information Generation

Figure 5:
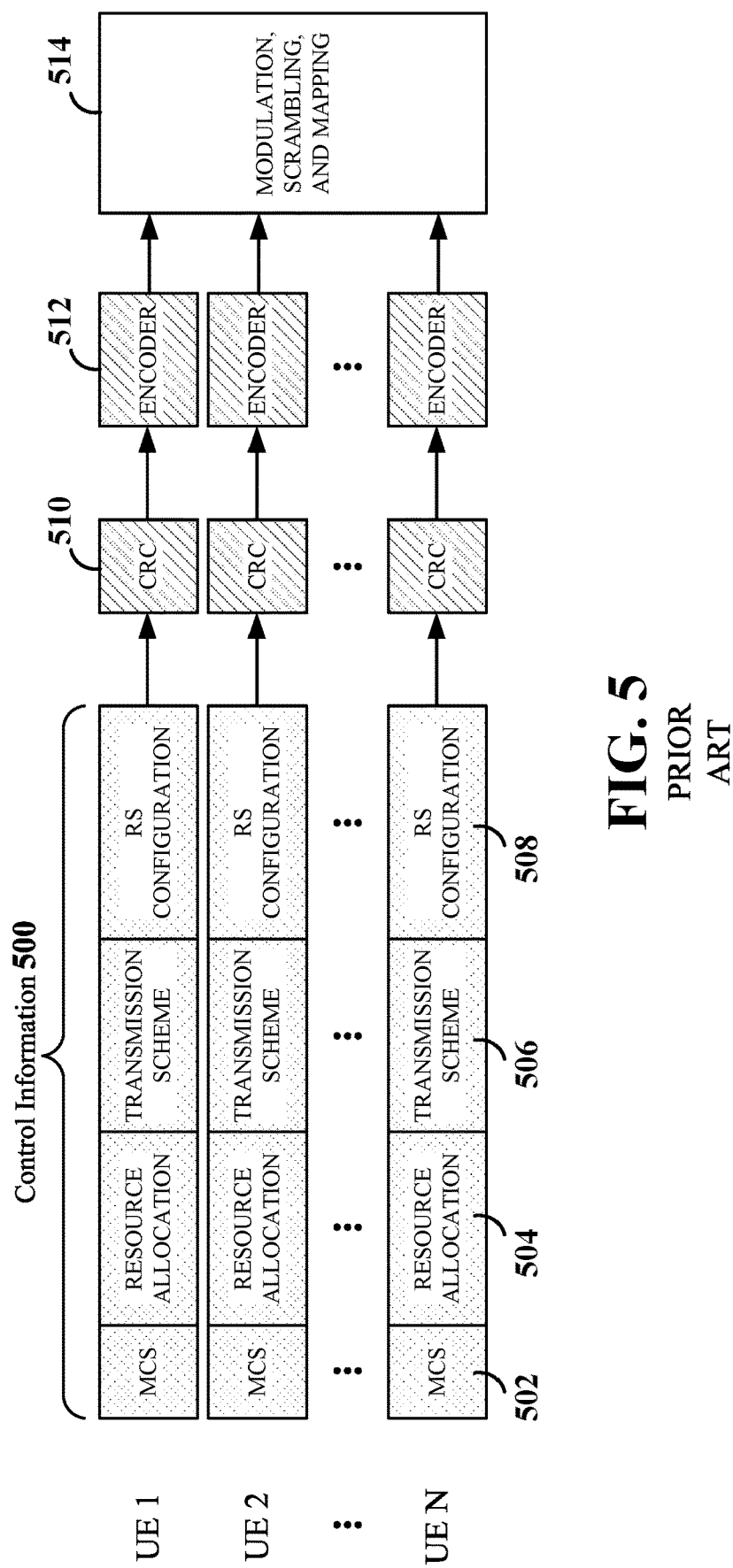
FIG. 5 is a schematic illustration of the generation of a control data transmission according to the prior art, utilizing separate encoding of the control information for each user.

FIG. 5 is a schematic illustration of the generation of a prior art control information transmission. As illustrated here, dedicated control information 500 for a given user or UE may include various fields for different types of information relating to control over user data traffic and traffic RS. For example, as illustrated in FIG. 5, a given UE's dedicated control information 500 may include a modulation order and coding scheme (MCS) 502, resource allocation 504 (e.g., time-frequency resources), a transmission scheme 506, a RS configuration 508, etc. Of course, this is only one example and any suitable set of dedicated control information 500 may be included for a particular UE.

As further illustrated, the dedicated control information 500 for a plurality of users or UEs (e.g., UE 1, UE 2, . . . , UE N) may be multiplexed into a given transmission of control information. That is, as described above, a downlink transmission from a scheduling entity may include dedicated control information 500 for a plurality of scheduled entities.

The dedicated control information 500 for each UE is subjected to a cyclic redundancy check (CRC) calculation block 510 to produce respective CRCs (also referred to herein as CRC information), which in some examples, may be scrambled with the destination UE's identity. For example, a UE may have a radio network temporary identifier (RNTI) or other suitable UE-specific identifier that may be known to the scheduling entity generating the CRCs. A receiving UE may perform an integrity check or CRC calculation taking its own RNTI into account, so that the CRC would only be verified for control information that includes a CRC scrambled with that UE's RNTI. The CRC typically includes 16 bits that are scrambled with the RNTI and then appended to the dedicated control information.

After adding the CRC to the dedicated control information, it is encoded by an encoder 512, and then subjected to a modulation, scrambling, and mapping block 514 to modulate, scramble, and/or map the encoded dedicated control information to resources in the wireless air interface (e.g., see FIG. 3).

When utilizing this above-described scheme to generate dedicated control information for transmission, each UE's dedicated control information 500 and its appended CRC is separately encoded. Accordingly, because the total amount of information being encoded is relatively small, the amount of coding gain that might be achieved by the encoder is less than it would be in comparison to a large block size. That is, larger block sizes can result in greater coding gain.

In addition, larger block sizes may allow for different types of encoding, such as polar coding. The error-correction performance of polar codes suffers with short to moderate block sizes. Therefore, block sizes of at least two hundred bits, and preferably three hundred to four hundred bits, are typically desired when utilizing polar coding. In some examples, each dedicated control information includes approximately sixty bits. Therefore, multiplexing the dedicated control information of four or more UEs will produce a block size suitable for polar coding.

Various aspects of the present disclosure provide for a transmitting device (e.g., a scheduling entity) to multiplex dedicated control information 500 for a plurality of users or UEs (e.g., scheduled entities) into a single information block and polar code the information block to produce a polar code block for transmission over a wireless air interface. That is, a polar encoder or polar coding algorithm may jointly encode the dedicated control information (and, in some examples, CRCs) for a plurality of scheduled entities. By combining/multiplexing the control information from a plurality of scheduled entities together, the block size sent to the polar encoder may be relatively large to improve the error correcting performance of polar coding. In addition, the coding gain provided by the encoder can be increased, potentially resulting in a lower bit error rate (BER) under the same signal-to-noise ratio (SNR) conditions.

Figure 6:
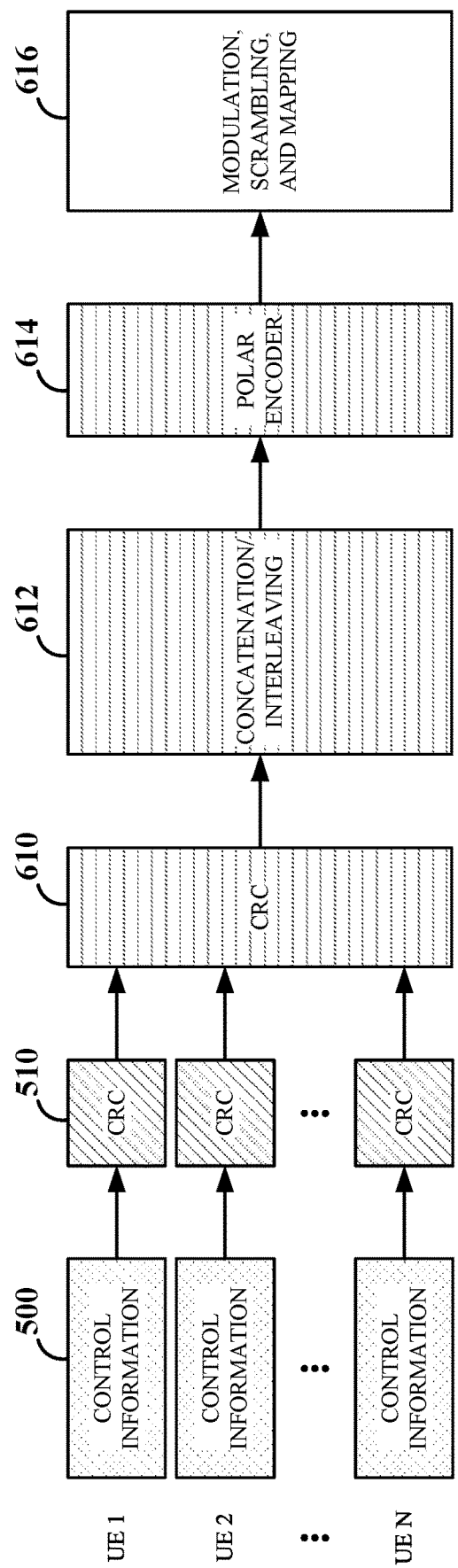
FIG. 6 is a schematic illustration of the generation of a control data transmission according to an exemplary embodiment utilizing joint encoding of multiple UEs' control information.

FIG. 6 is a schematic illustration of the generation of a control information transmission according to some aspects of the disclosure. In this illustration, a transmitting device may utilize joint encoding of multiple UE's (e.g., UE 1, UE 2, . . . UE N) dedicated control information 500. In various aspects of the disclosure, the size (e.g., DCI size as determined by the aggregation level) of each UE's dedicated control information 500 that is jointly encoded is the same. In this way, a UE may efficiently locate its dedicated control information within the jointly encoded block of multiple dedicated control information.

As illustrated, each UE's dedicated control information is subjected to a CRC calculation block 510, and a corresponding individual CRC may be appended to the UE's dedicated control information. As described above in the example illustrated in FIG. 5, the CRC for a given UE's control information may be scrambled with that UE's UE-specific identifier. In some examples, the UE-specific identifier is the RNTI. In other examples, the UE-specific identifier is a short connection identifier (CID), which has a length less than that of the RNTI. In various aspects of the disclosure, the size of the individual CRC for each dedicated control information may be reduced to reduce the CRC overhead. In some examples, each individual CRC may include five bits scrambled with the CID of the respective UE.

Following each UE's control information being given its own individual CRC, in an aspect of the disclosure, the control information for each of the plurality of UEs may be collectively subjected to a second, group CRC calculation block 610 to apply a group CRC to the plurality of UEs' control information. That is, a group CRC may be concatenated or interleaved (e.g., multiplexed) with a group of users' control information. By utilizing the group CRC, an individual UE may be able to verify the integrity of the received control information for the full group of UEs. For example, the group CRC may be scrambled with a group CID or group RNTI known to the group of UEs. In some examples, the group CRC may include sixteen bits, twenty-four bits, or thirty-two bits.

The full group of UEs' control information may be concatenated or interleaved by a concatenation/interleaving block 612 (e.g., to create a relatively large information block) that may then be encoded by a polar encoder 614 to produce a polar code block. The polar code block may then be subjected to a modulation, scrambling, and mapping block 616 to modulate, scrambled, and/or map the polar code block to suitable resources for transmission over a wireless air interface.

Polar Codes

Polar codes are linear block error correcting codes invented in 2007 by Erdal Arikan, and currently known to those skilled in the art. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

Polar codes may be considered as block codes. In a typical block code, an information sequence is split up into information blocks, each block having a length of K bits. An encoder at the transmitting device (scheduling entity) then mathematically adds redundancy to the information sequence, resulting in codewords having a length of N, where N>K. Here, the code rate R is the ratio between the message length and the block length: i.e., R=K/N. With polar codes, the codeword length N is typically a power of 2 (e.g., 256, 512, 1024, etc.) because the original construction of a polarizing matrix is based on the Kronecker product of $$\begin{bmatrix} 1 & 0 \\ 1 & 1 \end{bmatrix}.$$

For example, a generator matrix (e.g., a polarizing matrix) $G_N$ for generating a polar code with a block length of N can be expressed as:

$$G_N = B_N F^{\otimes n}$$

Here, $B_N$ is the bit-reversal permutation matrix for successive cancellation (SC) decoding (functioning in some ways similar to the interleaver function used by a turbo coder in LTE networks), and $F^{\otimes n}$ is the $n^{th}$ Kronecker power of F. The basic matrix F is $$\begin{bmatrix} 1 & 0 \\ 1 & 1 \end{bmatrix}.$$

The matrix $F^{\otimes n}$ is generated by raising the basic 2×2 matrix F by the $n^{th}$ Kronecker power. This matrix is a lower triangular matrix, in that all the entries above the main diagonal are zero. Because the bit-reversal permutation just changes the index of the rows, the matrix of $F^{\otimes n}$ may be analyzed instead. The matrix of $F^{\otimes n}$ can be expressed as:

$$F^{\otimes n} = \begin{bmatrix} 1 & 0 & 0 & & 0 & 0 & 0 & 0 \\ 1 & 1 & 0 & \cdots & 0 & 0 & 0 & 0 \\ 1 & 0 & 1 & & 0 & 0 & 0 & 0 \\ \vdots & & & \ddots & & & & \vdots \\ 1 & 0 & 0 & & 1 & 0 & 0 & 0 \\ 1 & 1 & 0 & & 1 & 1 & 0 & 0 \\ 1 & 0 & 1 & \cdots & 1 & 0 & 1 & 0 \\ 1 & 1 & 1 & & 1 & 1 & 1 & 1 \end{bmatrix}$$

The polar encoder may then generate a polar code block as:

$$x_1^N = u_1^N G_N = u_1^N B_N F^{\otimes n},$$

where $x_1^N = (x_1, x_2, \ldots, x_N)$ is the encoded bit sequence (e.g., bit sequence of the polar code block), and $u_1^N = (u_1, u_2, \ldots, u_N)$ is the encoding bit sequence (e.g., bit sequence of the information block).

Thus, the information bit vector u may include a number (N) of original bits that may be polar coded by the generating matrix $G_N$ to produce a corresponding number (N) of coded bits in the polar codeword x. In some examples, the information bit vector u may include a number of information bits, denoted K, and a number of frozen bits, denoted F. Frozen bits are bits that are set to a suitable predetermined value, such as 0 or 1. Thus, the value of the frozen bits may generally be known at both the transmitting device and the receiving device. The polar encoder, such as the polar encoder 614 shown in FIG. 6, may determine the number of information bits and the number of frozen bits based on the coding rate R. For example, the polar encoder 614 may select a coding rate R from a set of one or more coding rates and select K=N×R bits in the information block to transmit information. The remaining (N−K) bits in the information block may then be fixed as frozen bits F.

In order to determine which information block bits to set as frozen bits, the polar encoder 614 may further analyze the wireless channel over which the polar codeword may be sent. For example, the wireless channel for transmitting the polar codeword may be divided into a set of sub-channels, such that each encoded bit in the polar codeword is transmitted over one of the sub-channels. Thus, each sub-channel may correspond to a particular coded bit location in the polar codeword (e.g., sub-channel-1 may correspond to coded bit location containing coded bit $x_1$). The polar encoder 614 may identify the K best sub-channels for transmitting the information bits and determine the original bit locations in the information block contributing to (or corresponding to) the K best sub-channels. For example, based on the generating matrix, one or more of the original bits of the information block may contribute to each of the coded bits of the polar codeword. Thus, based on the generating matrix, the polar encoder 614 may determine K original bit locations in the information block corresponding to the K best sub-channels, designate the K original bit locations for information bits and designate the remaining original bit locations in the information block for frozen bits.

In some examples, the polar encoder 614 may determine the K best sub-channels by performing density evolution or Gaussian approximation. Density evolution is generally known to those skilled in the art, and therefore the details thereof are not described herein. For example, construction of polar codes based on density evolution is described in R. Mori and T. Tanaka PERFORMANCE OF POLAR CODES WITH THE CONSTRUCTION USING DENSITY EVOLUTION, IEEE Commun. Lett., vol. 13, no. 7, pp. 519-521, July 2009. Gaussian approximation is a lower complexity version of density evolution, and is also generally known to those skilled in the art. For example, construction of polar codes based on Gaussian approximation is described in V. Miloslayskaya, SHORTENED POLAR CODES, IEEE Trans. on Information Theory, June 2015.

The polar encoder 614 may perform density evolution or Gaussian approximation to calculate a respective reliability metric, such as a bit error probability (BEP) and/or log likelihood ratio (LLR), for each of the for each of the original bit locations. For example, the LLRs of the coded bit locations are known from the sub-channel conditions (e.g., based on the respective SNRs of the sub-channels). Thus, since one or more of the original bits of the information block may contribute to each of the coded bits of the codeword, the LLRs of each of the original bit locations may be derived from the known LLRs of the coded bit locations by performing density evolution or Gaussian approximation. Based on the calculated original bit location LLRs, the polar encoder 614 may sort the sub-channels and select the K best sub-channels (e.g., "good" sub-channels) to transmit the information bits. The polar encoder 614 may then set the original bit locations of the information block corresponding to the K best sub-channels as including information bits and the remaining original bit locations corresponding to the N−K sub-channels (e.g., "bad" sub-channels) as including frozen bits.

The UE (scheduled entity) may receive a noisy version of x, and has to decode x or, equivalently, u. Polar codes may be decoded with a simple successive cancellation (SC) decoder, which has a decoding complexity of O (N log N) and can achieve Shannon capacity when N is very large. However, for short and moderate block lengths, the error rate performance of polar codes significantly degrades. Therefore, SC-list (SCL) decoding may be utilized to improve the polar coding error rate performance. With SC-list decoding, instead of only keeping one decoding path (as in simple SC decoders), L decoding paths are maintained, where L>1. At each decoding stage, the decoder at the UE discards the least probable (worst) decoding paths and keeps only the L best decoding paths. For example, instead of selecting a value $u_i$ at each decoding stage, two decoding paths corresponding to either possible value of $u_i$ are created and decoding is continued in two parallel decoding threads (2*L). To avoid the exponential growth of the number of decoding paths, at each decoding stage, only the L most likely paths are retained. At the end, the decoder at the UE will have a list of L candidates for $u_1^N$, out of which the most likely candidate is selected. Thus, when the decoder completes the SC-list decoding algorithm, the decoder returns a single codeword.

In an aspect of the disclosure, the UE may utilize the group CRC information to perform CRC-aided successive cancellation list (CA-SCL) decoding. In CA-SCL, the group CRC is utilized to select the output codeword from the L candidates. For example, at the base station (scheduling entity), the scheduling entity may compute the group CRC bits, as described above, and append the group CRC bits to the information bits. At the UE (scheduled entity), the polar decoder may use the group CRC to test each of the L candidates for errors. If more than one candidate passes (e.g., produces a remainder of 0), the polar decoder may select the most probable candidate among those that pass.

Jointly Polar Encoded PDCCH

Figure 7:
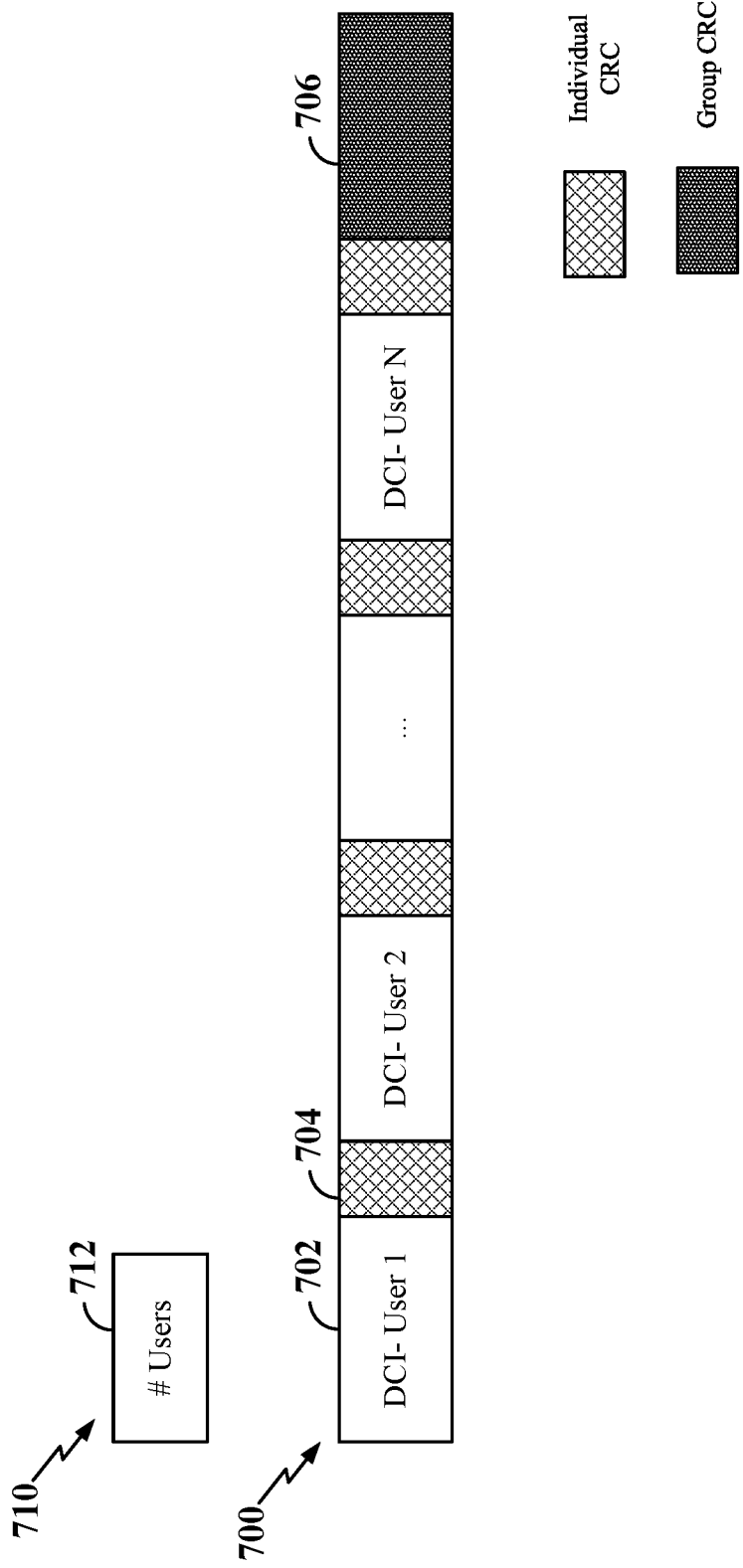
FIG. 7 is a schematic illustration of an exemplary structure of a jointly polar encoded PDCCH.

FIG. 7 is a schematic illustration of an exemplary structure of a jointly polar encoded PDCCH 700. The PDCCH 700 includes dedicated control information 702 (e.g., dedicated DCI) for a plurality of users (e.g., DCI-User 1, DCI-User 2, . . . DCI-User N). An individual CRC 704 is appended to (or concatenated with) each DCI 702 to enable a UE to verify the integrity of the received DCI. In some examples, each individual CRC 704 is scrambled with the CID of the UE intended to receive the DCI. For example, a receiving UE may perform an integrity check or CRC calculation taking its own CID into account, so that the CRC would only be verified for DCI that includes a CRC scrambled with that UE's CID.

The jointly polar encoded PDCCH 700 may further include a group CRC 706 appended to (or concatenated with) the plurality of DCI 702 and corresponding individual CRCs 704. In some examples, the group CRC 706 may be scrambled with a group CID known to the UEs to enable each UE to verify the integrity of the PDCCH 700. In an aspect of the disclosure, if the group CRC 706 fails, a receiving UE may still be able to validate the dedicated DCI 702 within the PDCCH 700 intended for the UE utilizing the individual CRC 704.

In some examples, sub-channels of the PDCCH polar code block are allocated to DCI based on the channel conditions of the UE's. The channel conditions may be determined based on channel state information (CSI) (e.g., the channel quality indicator (CQI)), the signal-to-interference-noise ratio (SINR) or other channel measurements. For example, the sub-channels with the highest reliability metrics may be allocated to UEs experiencing the worst channel conditions. In this example, from the K best sub-channels (as sorted during allocation of information bits and frozen bits, described above), the scheduling entity may ascertain those sub-channels having the highest reliability metric (e.g., highest LLRs) and designate the original bit locations in the information block corresponding to the highest reliability sub-channels to carry the dedicated DCI of the UEs with worst channel conditions. In general, the channel conditions of the UEs having DCI 702 within the PDCCH 700 should be similar since each DCI has the same size (e.g., same aggregation level). However, slight variances in channel conditions may be accommodated by allocating sub-channels in order of channel conditions (e.g., the DCI associated with the worst channel conditions are allocated to the highest reliability metric sub-channels).

To assist receiving UEs in decoding the polar coded PDCCH 700, the scheduling entity may further transmit an information message 710 including a number of UEs 712 having dedicated control information within the jointly polar encoded PDCCH 700. In some examples, the information message 710 includes five bits to indicate the number of UEs 712. The information message 710 may further be encoded (e.g., using a 32-bit Walsh code). From the number of UEs 712, a receiving UE may determine the size of the polar code block (e.g., based on the aggregation level), and therefore, the UE is able to decode the jointly polar encoded PDCCH 700. In some examples, the receiving UE may utilize CA-SCL decoding to decode the jointly polar encoded PDCCH 700. After polar decoding, the receiving UE may locate the particular DCI 702 for that UE within the decoded PDCCH using the individual CRC 704.

Figure 8:
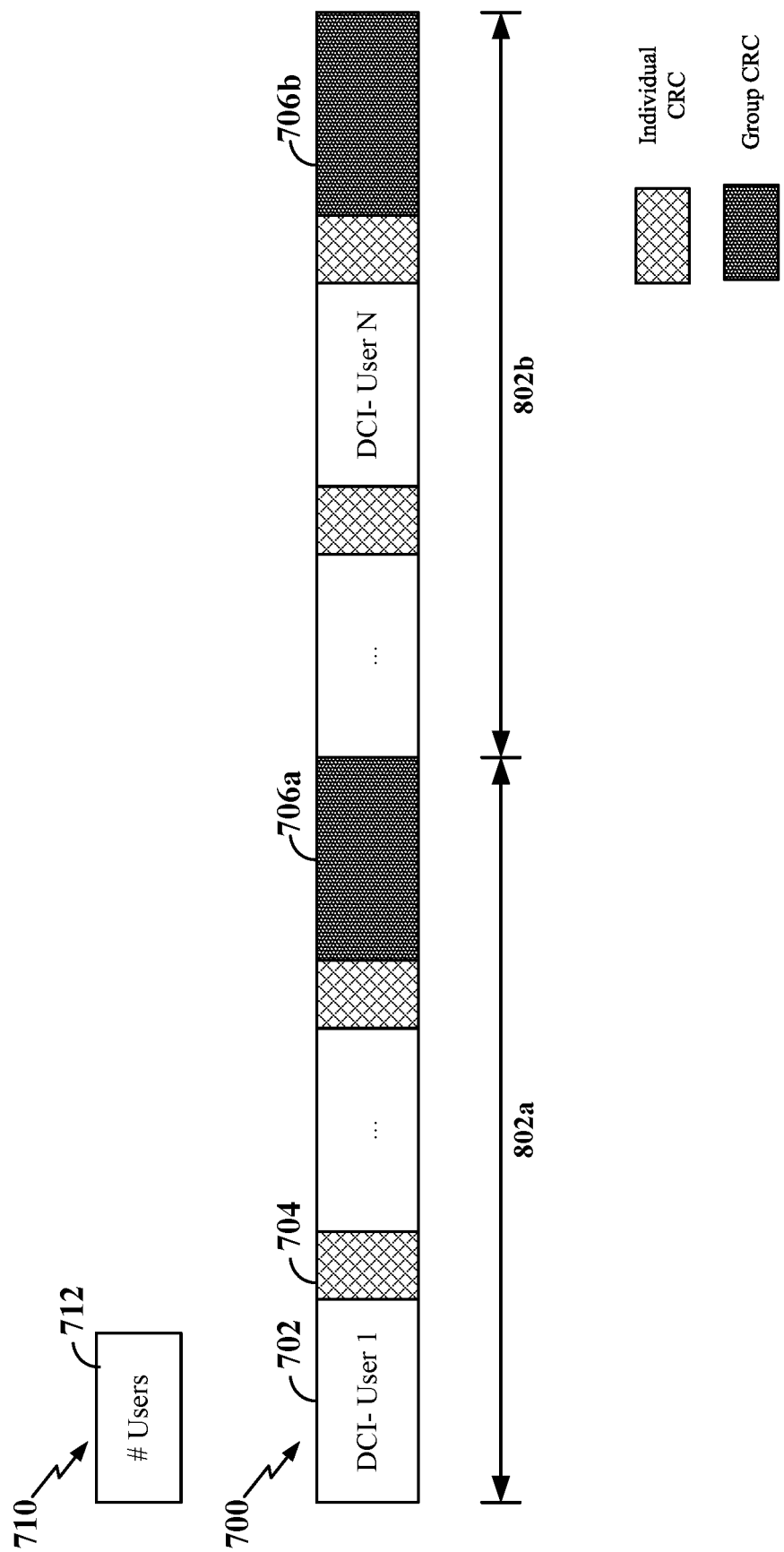
FIG. 8 is a schematic illustration of another exemplary structure of a jointly polar encoded PDCCH.

FIG. 8 is a schematic illustration of another exemplary structure of a jointly polar encoded PDCCH 700. In the example shown in FIG. 8, the dedicated DCI 702 are separated into two or more control information groups 802*a* and 802*b* within the jointly encoded PDCCH 700. In an aspect of the disclosure, the DCI 702 may be grouped in accordance with channel conditions associated with each of the UEs. In some examples, the sub-channels of the polar encoded PDCCH 700 may be sorted based on their reliability metrics into the control information groups 802*a* and 802*b*, and each of the dedicated DCI 702 may be placed within one of the control information groups (e.g., control information group 802*a* or control information group 802*b*) based on the channel conditions and the reliability metrics. For example, the sub-channels with the highest reliability metrics may be within control information group 802*a*, while the sub-channels with the lowest reliability metrics may be within control information group 802*b*. In this way, UEs experiencing the worst channel conditions of the UEs having DCI 702 within the PDCCH 700 may have their DCI 702 within control information group 802*a*, while UEs experiencing the best channel conditions of the UEs having DCI 702 within the PDCCH 700 may have their DCI 702 within control information group 802*b*.

Each control information group 802*a* and 802*b* may further include a respective group CRC 706*a* and 706*b* that may be used by the receiving UEs to verify the integrity of the control information group. In some examples, each group CRC 706*a* and 706*b* may be scrambled with a different group CID to enable a receiving UE to ascertain which control information group 802*a* or 802*b* contains the dedicated DCI 702 for that receiving UE.

Scheduling Entity

Figure 9:
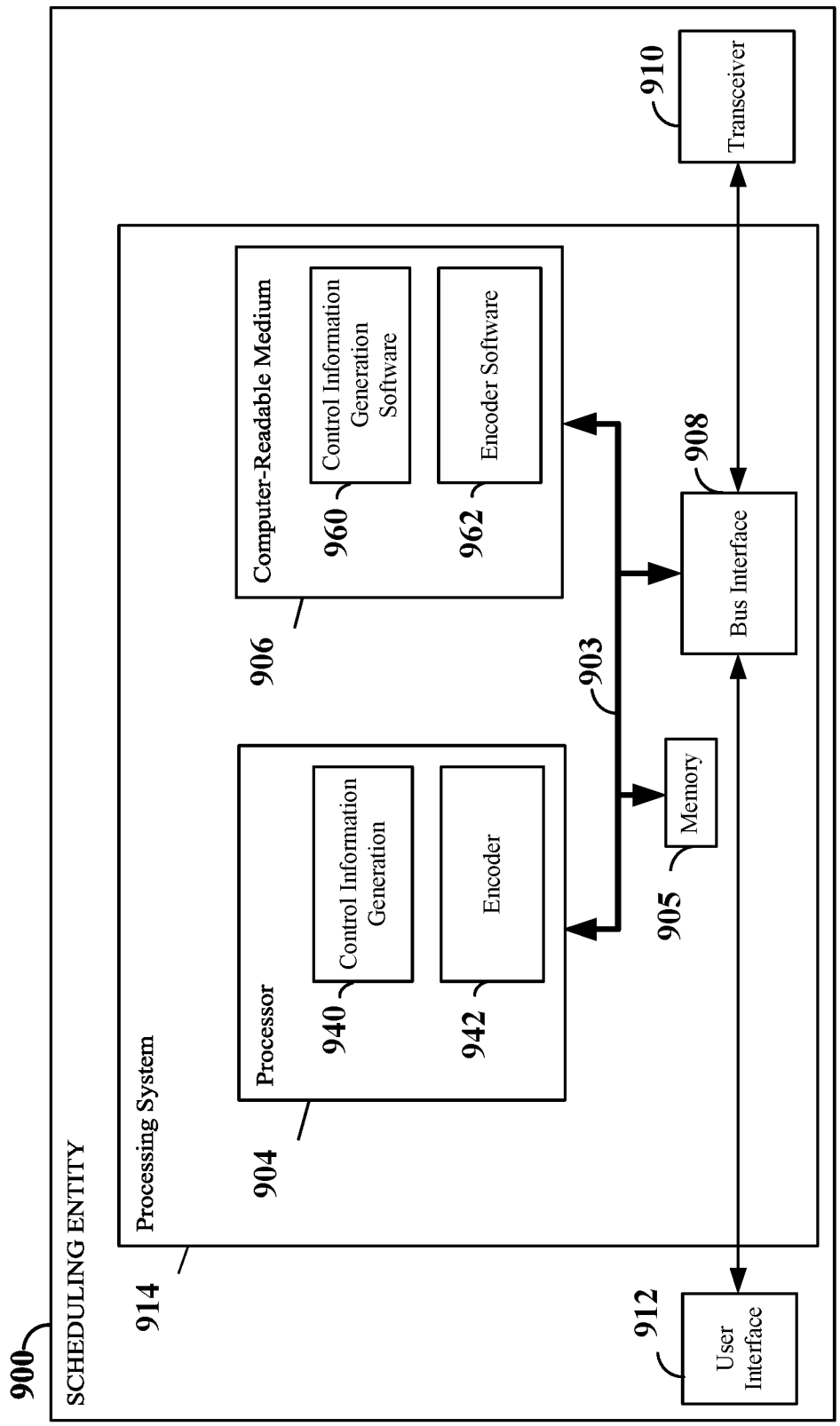
FIG. 9 is a block diagram illustrating an example of a hardware implementation for an apparatus employing a processing system.

FIG. 9 is a block diagram illustrating an example of a hardware implementation for a scheduling entity 900 employing a processing system 914. For example, the scheduling entity 900 may be a user equipment (UE) as illustrated in any one or more of FIGS. 1 and/or 2. In another example, the scheduling entity 900 may be a base station as illustrated in any one or more of FIGS. 1 and/or 2.

The scheduling entity 900 may be implemented with a processing system 914 that includes one or more processors 904. Examples of processors 904 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the scheduling entity 900 may be configured to perform any one or more of the functions described herein. That is, the processor 904, as utilized in a scheduling entity 900, may be used to implement any one or more of the processes and procedures described below.

In this example, the processing system 914 may be implemented with a bus architecture, represented generally by the bus 902. The bus 902 may include any number of interconnecting buses and bridges depending on the specific application of the processing system 914 and the overall design constraints. The bus 902 communicatively couples together various circuits including one or more processors (represented generally by the processor 904), a memory 905, and computer-readable media (represented generally by the computer-readable medium 906). The bus 902 may also link various other circuits such as timing sources, peripherals, voltage regulators, and power management circuits, which are well known in the art, and therefore, will not be described any further. A bus interface 908 provides an interface between the bus 902 and a transceiver 910. The transceiver 910 provides a communication interface or means for communicating with various other apparatus over a transmission medium. Depending upon the nature of the apparatus, a user interface 912 (e.g., keypad, display, speaker, microphone, joystick) may also be provided.

The processor 904 is responsible for managing the bus 902 and general processing, including the execution of software stored on the computer-readable medium 906. The software, when executed by the processor 904, causes the processing system 914 to perform the various functions described below for any particular apparatus. The computer-readable medium 906 and the memory 905 may also be used for storing data that is manipulated by the processor 904 when executing software.

One or more processors 904 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 906. The computer-readable medium 906 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 906 may reside in the processing system 914, external to the processing system 914, or distributed across multiple entities including the processing system 914. The computer-readable medium 906 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 904 may include circuitry configured for various functions. For example, the processor 904 may include control information generation circuitry 940 configured for various functions, including, for example, generating dedicated control information (e.g., dedicated DCI) for a plurality of scheduled entities, generating individual CRCs for each of the dedicated DCI, concatenating the dedicated DCI and associated individual CRCs into an information block, generating a group CRC for the information block, and concatenating the group CRC with the information block. For example, the control information generation circuitry 940 may be configured to implement one or more of the functions described in relation to FIGS. 5-8 and/or 11-15. The control information generation circuitry 940 may operate in coordination with control information generation software 960.

The processor 904 may further include encoder circuitry 942 configured for various functions, including, for example, polar encoding an information block containing dedicated DCI for multiple scheduled entities for a wireless transmission. The encoder circuitry 942 may further be configured to encode (e.g., using Walsh encoding) an information message indicating a number of scheduled entities containing dedicated DCI within the information block. For example, the encoder circuitry 942 may be configured to implement one or more of the functions described below in relation to FIGS. 6-8 and/or 11-15. The encoder circuitry 942 may operate in coordination with encoder software 962.

Scheduled Entity

Figure 10:
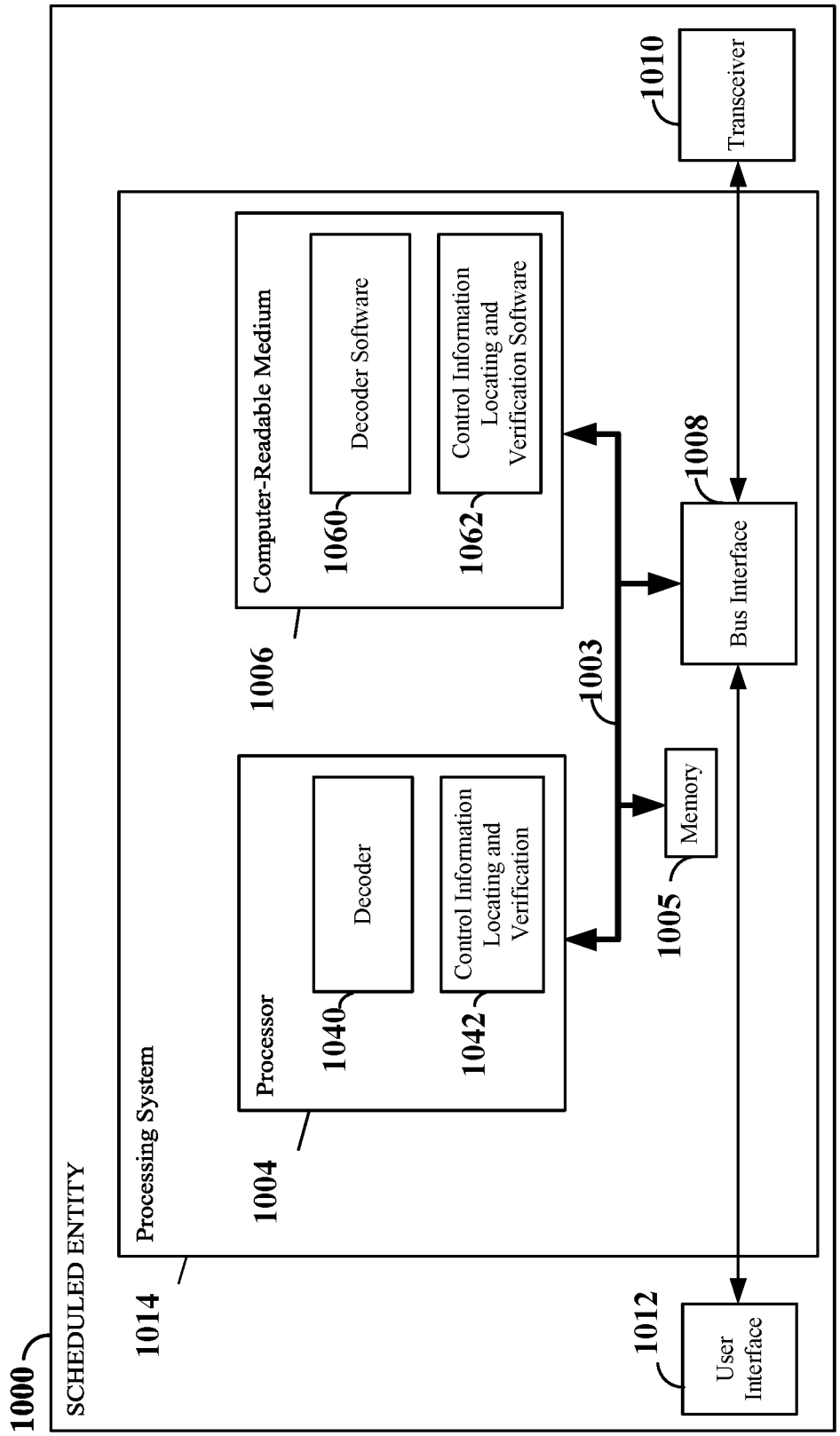
FIG. 10 is a block diagram illustrating an example of a hardware implementation for an apparatus employing a processing system.

FIG. 10 is a conceptual diagram illustrating an example of a hardware implementation for an exemplary scheduled entity 1000 employing a processing system 1014. In accordance with various aspects of the disclosure, an element, or any portion of an element, or any combination of elements may be implemented with a processing system 1014 that includes one or more processors 1004. For example, the scheduled entity 1000 may be a user equipment (UE) as illustrated in any one or more of FIGS. 1 and/or 2.

The processing system 1014 may be substantially the same as the processing system 914 illustrated in FIG. 9, including a bus interface 1008, a bus 1002, memory 1005, a processor 1004, and a computer-readable medium 1006. Furthermore, the scheduled entity 1000 may include a user interface 1012 and a transceiver 1010 substantially similar to those described above in FIG. 9. That is, the processor 1004, as utilized in a scheduled entity 1000, may be used to implement any one or more of the processes described below.

In some aspects of the disclosure, the processor 1004 may include decoder circuitry 1040 configured for various functions, including, for example, polar decoding a jointly encoded PDCCH containing dedicated DCI for multiple scheduled entities received over a wireless communication interface. The decoder circuitry 1040 may further be configured to decode an information message indicating the number of scheduled entities containing dedicated DCI within the jointly encoded PDCCH. For example, the polar decoder circuitry 1040 may be configured to implement one or more of the functions described in relation to FIGS. 5-8 and/or 16-18. The decoder circuitry 1040 may operate in coordination with decoder software 1060.

The processor 1004 may further include control information locating and verification circuitry 1042 configured for various functions, including, for example, locating a dedicated DCI for the scheduled entity within the decoded PDCCH based on individual CRC appended to each of the dedicated DCI. For example, the control information locating and verification circuitry 1042 may be configured to implement one or more of the functions described in relation to FIGS. 6-8 and/or 16-18. The control information locating and verification circuitry 1042 may operate in coordination with control information locating and verification software 1062.

Joint Polar Encoding Process

Figure 11:
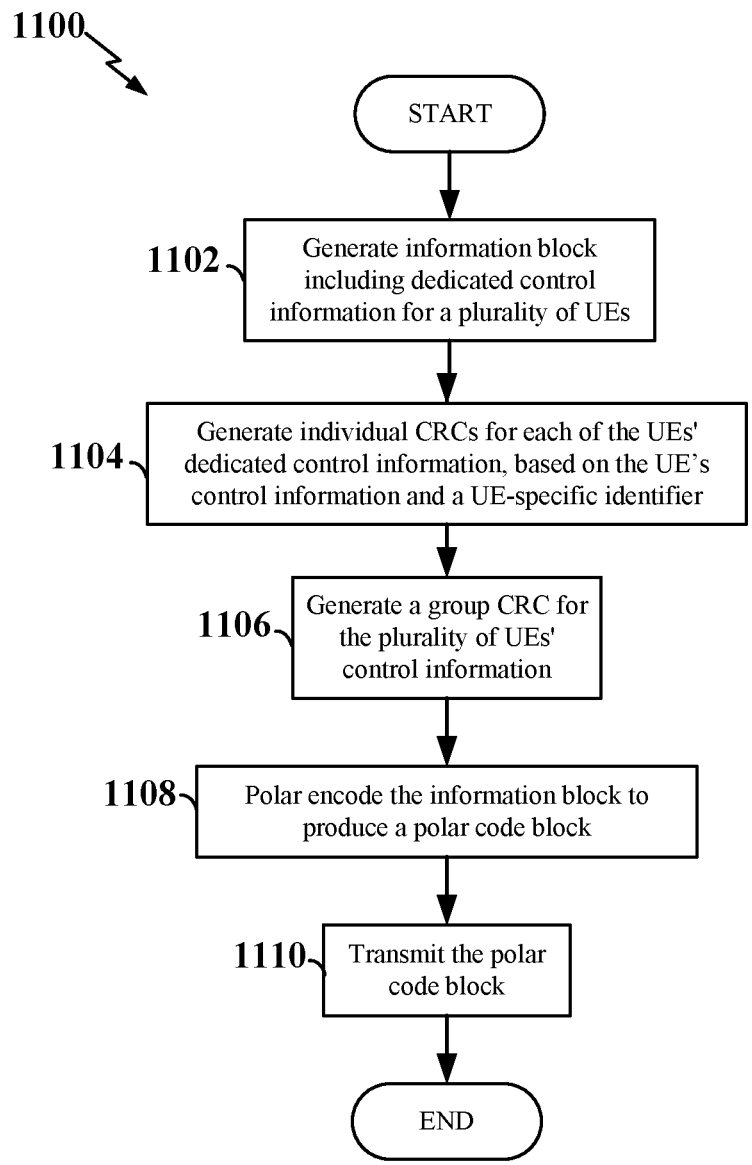
FIG. 11 is a flow chart illustrating an exemplary process for jointly polar encoding control information for a plurality of UEs according to some aspects of the disclosure.

FIG. 11 is a flow chart illustrating an exemplary process 1100 for jointly polar encoding dedicated control information for a plurality of UEs (scheduled entities) according to some aspects of the disclosure. As described below, some or all illustrated features may be omitted in a particular implementation within the scope of the present disclosure, and some illustrated features may not be required for implementation of all embodiments. In some examples, the process 1100 may be carried out by the scheduling entity 900 illustrated in FIG. 9. In some examples, the process 1100 may be carried out by any suitable apparatus or means for carrying out the functions or algorithm described below.

At block 1102, the scheduling entity may generate an information block including dedicated control information for a plurality of UEs. For example, the dedicated control information may correspond to the dedicated control information described above and illustrated in FIGS. 5-8. At block 1104, the scheduling entity may generate individual CRCs for each of the UEs' dedicated control information. Here, each individual CRC may be based on the corresponding UE's dedicated control information, and further, based on the corresponding UE's UE-specific identifier (e.g., an RNTI or CID). At block 1106, the scheduling entity may generate one or more group CRCs for the information block containing the plurality of UEs' dedicated control information. For example, the control information generation circuitry 940 shown and described above in connection with FIG. 9 may generate the information block, individual CRCs, and group CRC(s).

At block 1108, the scheduling entity may polar encode the information block by jointly polar encoding the full set of dedicated control information for the plurality of UEs, including the individual CRCs and the group CRC(s). For example, the encoder circuitry 942 shown and described above in connection with FIG. 9 may polar encode the information block to produce a polar code block containing the dedicated control information for the plurality of UEs, individual CRCs and group CRC(s). At block 1110, the scheduling entity may transmit the polar code block over the air interface. For example, the scheduling entity may utilize the transceiver 910 shown and described above in connection with FIG. 9 to transmit the polar code block over the air interface.

Figure 12:
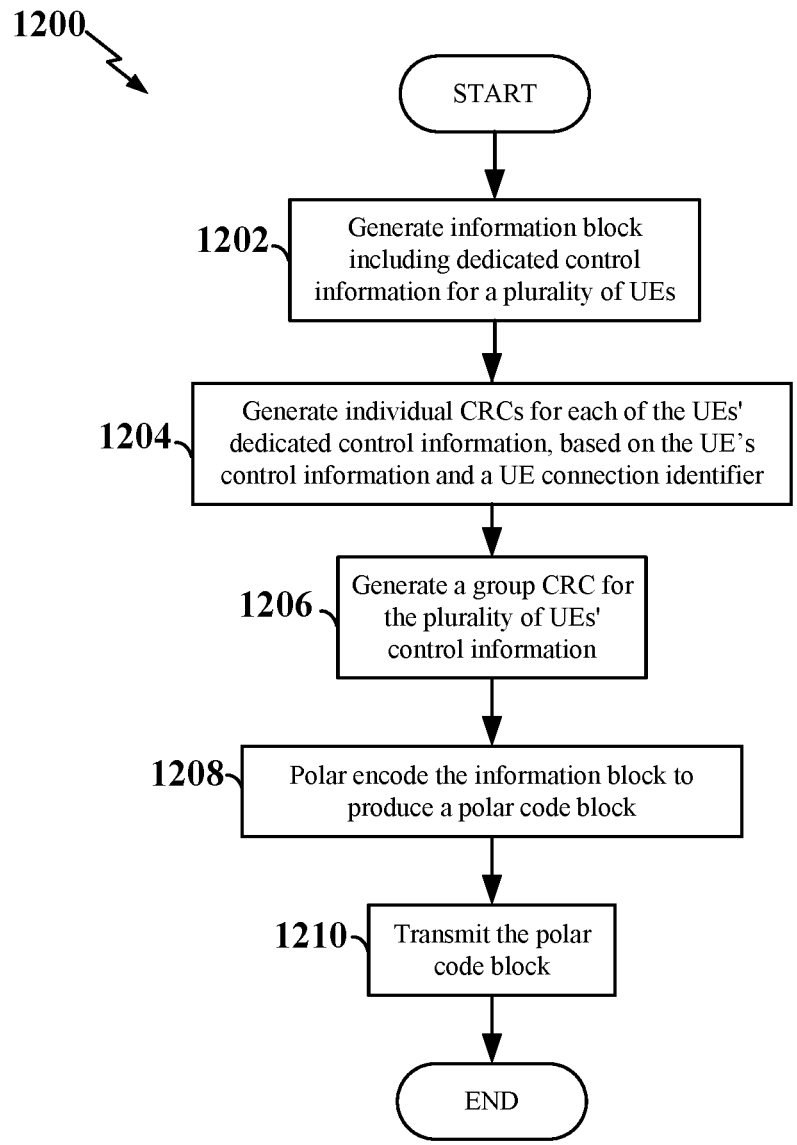
FIG. 12 is a flow chart illustrating another exemplary process for jointly polar encoding control information for a plurality of UEs according to some aspects of the disclosure.

FIG. 12 is a flow chart illustrating another exemplary process 1200 for jointly polar encoding dedicated control information for a plurality of UEs (scheduled entities) according to some aspects of the disclosure. As described below, some or all illustrated features may be omitted in a particular implementation within the scope of the present disclosure, and some illustrated features may not be required for implementation of all embodiments. In some examples, the process 1200 may be carried out by the scheduling entity 900 illustrated in FIG. 9. In some examples, the process 1200 may be carried out by any suitable apparatus or means for carrying out the functions or algorithm described below.

At block 1202, the scheduling entity may generate an information block including dedicated control information for a plurality of UEs. For example, the dedicated control information may correspond to the dedicated control information described above and illustrated in FIGS. 5-8. At block 1204, the scheduling entity may generate individual CRCs for each of the UEs' dedicated control information. Here, each individual CRC may be based on the corresponding UE's dedicated control information (CID), which has a length less than that of the RNTI. In various aspects of the disclosure, the size of the individual CRC for each dedicated control information may be reduced to reduce the CRC overhead. In some examples, each individual CRC may include five bits scrambled with the CID of the respective UE. At block 1206, the scheduling entity may generate one or more group CRCs for the information block containing the plurality of UEs' dedicated control information. For example, the control information generation circuitry 940 shown and described above in connection with FIG. 9 may generate the information block, individual CRCs, and group CRC(s).

At block 1208, the scheduling entity may polar encode the information block by jointly polar encoding the full set of dedicated control information for the plurality of UEs, including the individual CRCs and the group CRC(s). For example, the encoder circuitry 942 shown and described above in connection with FIG. 9 may polar encode the information block to produce a polar code block containing the dedicated control information for the plurality of UEs, individual CRCs and group CRC(s). At block 1210, the scheduling entity may transmit the polar code block over the air interface. For example, the scheduling entity may utilize the transceiver 910 shown and described above in connection with FIG. 9 to transmit the polar code block over the air interface.

Figure 13:
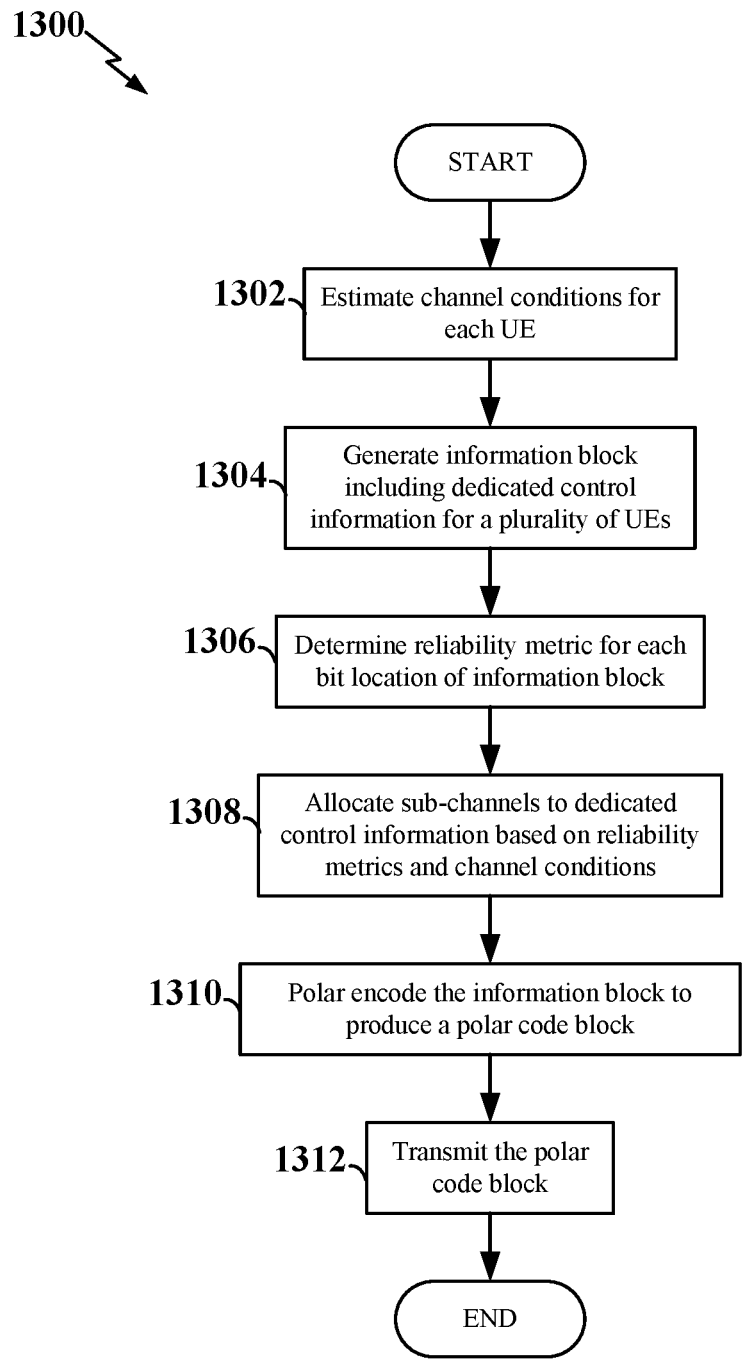
FIG. 13 is a flow chart illustrating another exemplary process for jointly polar encoding control information for a plurality of UEs according to some aspects of the disclosure.

FIG. 13 is a flow chart illustrating another exemplary process 1300 for jointly polar encoding dedicated control information for a plurality of UEs (scheduled entities) according to some aspects of the disclosure. As described below, some or all illustrated features may be omitted in a particular implementation within the scope of the present disclosure, and some illustrated features may not be required for implementation of all embodiments. In some examples, the process 1300 may be carried out by the scheduling entity 900 illustrated in FIG. 9. In some examples, the process 1300 may be carried out by any suitable apparatus or means for carrying out the functions or algorithm described below.

At block 1302, the scheduling entity may estimate the channel conditions for each of a plurality of UEs. In some examples, the channel conditions may be determined based on channel state information (CSI) (e.g., the channel quality indicator (CQI)), the signal-to-interference-noise ratio (SINR) or other channel measurements. At block 1304, the scheduling entity may generate an information block including dedicated control information for the plurality of UEs. For example, the dedicated control information may correspond to the dedicated control information described above and illustrated in FIGS. 5-8. In some examples, the information block may further include an individual CRC for each dedicated control information and one or more group CRCs for the information block. For example, the control information generation circuitry 940 shown and described above in connection with FIG. 9 may generate the information block, individual CRCs, and group CRC(s).

At block 1306, the scheduling entity may determine a reliability metric for each bit location of the information block. In some examples, the scheduling entity may calculate a respective reliability metric, such as a bit error probability (BEP) and/or log likelihood ratio (LLR), for each of the for each of the bit locations of the information block. At block 1308, the scheduling entity may allocate sub-channels to dedicated control information based on the reliability metrics and the channel conditions. For example, the encoder circuitry 942 shown and described above in connection with FIG. 9 may determine the reliability metrics and allocate sub-channels to dedicated control information based on the reliability metrics and channel conditions.

For example, the scheduling entity may sort the channel conditions of the UEs in order from worst channel conditions to best channel conditions to produce a channel condition order. The scheduling entity may also sort the sub-channels based on the calculated bit location LLRs in order from a highest reliability sub-channel to a lowest reliability sub-channel to produce a sub-channel reliability order. The scheduling entity may then allocate the sub-channels to the dedicated control information utilizing the channel condition order and the sub-channel reliability order. As a result, the dedicated control information for a worst scheduled entity (e.g., the scheduled entity having the worst channel conditions) may be allocated to the highest reliability sub-channel(s) and the dedicated control information for a best scheduled entity (e.g., the scheduled entity having the best channel conditions) may be allocated to the lowest reliability sub-channel(s). The scheduling entity may then determine the bit locations in the information block contributing to (or corresponding to) the sub-channels and place the dedicated control information within the bit locations of the information block based on the sub-channel allocations.

At block 1310, the scheduling entity may polar code the information block to produce a polar code block by jointly polar encoding the full set of dedicated control information for the plurality of UEs, including the individual CRCs and the group CRC(s). For example, the encoder circuitry 942 shown and described above in connection with FIG. 9 may polar encode the information block to produce the polar code block containing the dedicated control information for the plurality of UEs, individual CRCs and group CRC(s). At block 1312, the scheduling entity may transmit the polar code block over the air interface. For example, the scheduling entity may utilize the transceiver 910 shown and described above in connection with FIG. 9 to transmit the polar code block over the air interface.

Figure 14:
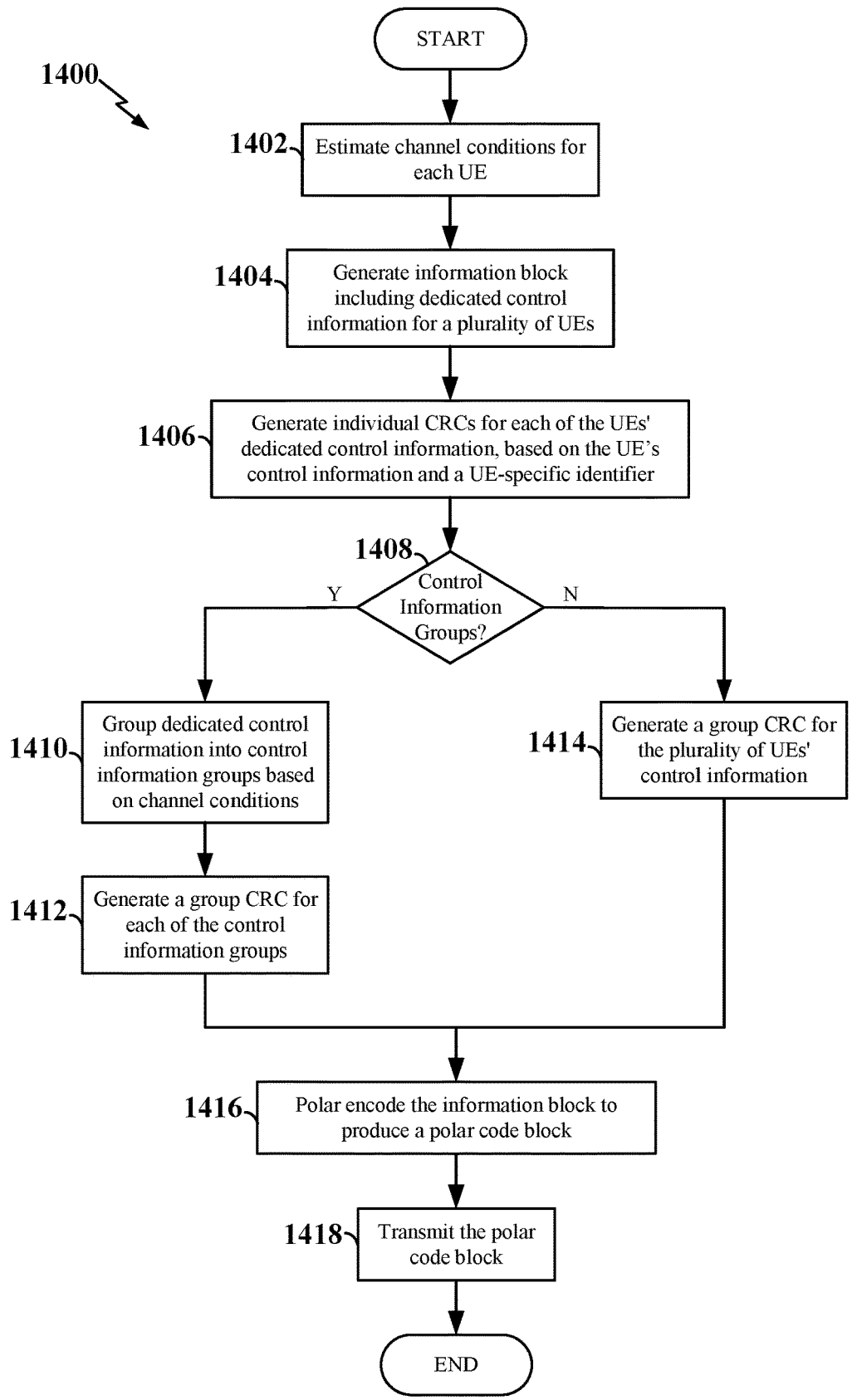
FIG. 14 is a flow chart illustrating another exemplary process for jointly polar encoding control information for a plurality of UEs according to some aspects of the disclosure.

FIG. 14 is a flow chart illustrating another exemplary process 1400 for jointly polar encoding dedicated control information for a plurality of UEs (scheduled entities) according to some aspects of the disclosure. As described below, some or all illustrated features may be omitted in a particular implementation within the scope of the present disclosure, and some illustrated features may not be required for implementation of all embodiments. In some examples, the process 1400 may be carried out by the scheduling entity 900 illustrated in FIG. 9. In some examples, the process 1300 may be carried out by any suitable apparatus or means for carrying out the functions or algorithm described below.

At block 1402, the scheduling entity may estimate the channel conditions for each of a plurality of UEs. In some examples, the channel conditions may be determined based on channel state information (CSI) (e.g., the channel quality indicator (CQI)), the signal-to-interference-noise ratio (SINR) or other channel measurements. At block 1404, the scheduling entity may generate an information block including dedicated control information for the plurality of UEs. For example, the dedicated control information may correspond to the dedicated control information described above and illustrated in FIGS. 5-8.

At block 1406, the scheduling entity may generate individual CRCs for each of the UEs' dedicated control information. Here, each individual CRC may be based on the corresponding UE's dedicated control information, and further, based on the corresponding UE's UE-specific identifier (e.g., an RNTI or CID). At block 1408, the scheduling entity may determine whether control information groups may be utilized for the dedicated control information.

If control information groups are to be used (Y branch of block 1408), at block 1410, the scheduling entity may group the dedicated control information into control information groups in accordance with the channel conditions associated with each of the UEs. In some examples, as described above in reference to FIG. 13, the sub-channels may be sorted based on their reliability metrics into the control information groups, and each of the dedicated control information may be placed within one of the control information groups based on the channel conditions and the reliability metrics. For example, the UEs experiencing the worst channel conditions may have their dedicated control information allocated to sub-channels within a highest reliability control information group, while UEs experiencing the best channel conditions may have their dedicated control information allocated to sub-channels within a lowest reliability control information group.

At block 1412, the scheduling entity may then generate a respective group CRC for each control information group of the information block. However, if control information groups are not utilized (N branch of block 1408), at block 1414, the scheduling entity may generate a single group CRC for the information block containing the plurality of UEs' dedicated control information. For example, the control information generation circuitry 940 together with the encoder circuitry 942 shown and described above in connection with FIG. 9 may generate the information block, individual CRCs, and group CRC(s).

At block 1416, the scheduling entity may polar code the information block to produce a polar code block by jointly polar encoding the full set of dedicated control information for the plurality of UEs, including the individual CRCs and the group CRC(s). For example, the encoder circuitry 942 shown and described above in connection with FIG. 9 may polar encode the information block to produce the polar code block containing the dedicated control information for the plurality of UEs, individual CRCs and group CRC(s). At block 1418, the scheduling entity may transmit the polar code block over the air interface. For example, the scheduling entity may utilize the transceiver 910 shown and described above in connection with FIG. 9 to transmit the polar code block over the air interface.

Figure 15:
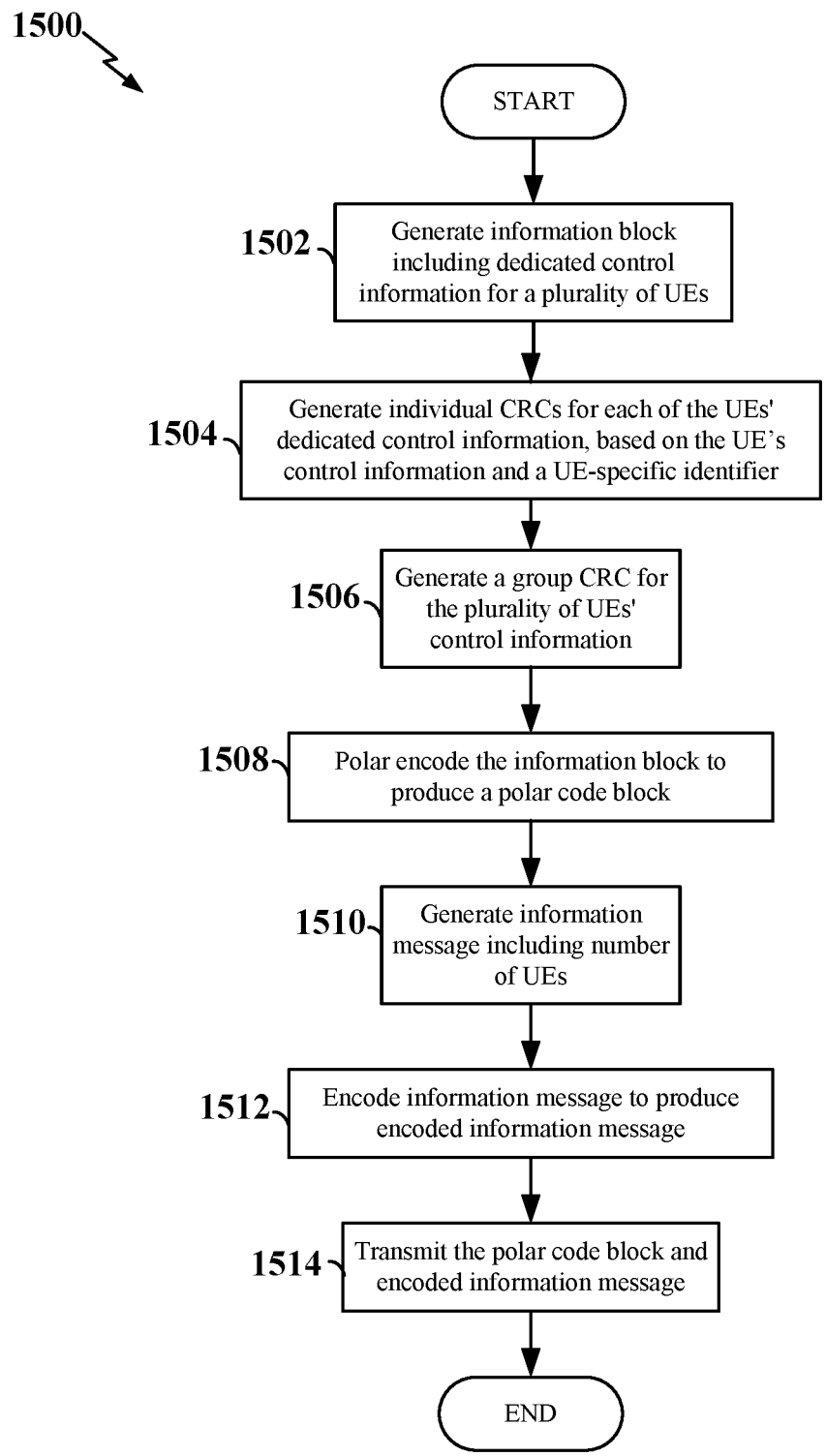
FIG. 15 is a flow chart illustrating another exemplary process for jointly polar encoding control information for a plurality of UEs according to some aspects of the disclosure.

FIG. 15 is a flow chart illustrating another exemplary process 1500 for jointly polar encoding dedicated control information for a plurality of UEs (scheduled entities) according to some aspects of the disclosure. As described below, some or all illustrated features may be omitted in a particular implementation within the scope of the present disclosure, and some illustrated features may not be required for implementation of all embodiments. In some examples, the process 1500 may be carried out by the scheduling entity 900 illustrated in FIG. 9. In some examples, the process 1500 may be carried out by any suitable apparatus or means for carrying out the functions or algorithm described below.

At block 1502, the scheduling entity may generate an information block including dedicated control information for a plurality of UEs. For example, the dedicated control information may correspond to the dedicated control information described above and illustrated in FIGS. 5-8. At block 1504, the scheduling entity may generate individual CRCs for each of the UEs' dedicated control information. Here, each individual CRC may be based on the corresponding UE's dedicated control information, and further, based on the corresponding UE's UE-specific identifier (e.g., an RNTI or CID). At block 1506, the scheduling entity may generate one or more group CRCs for the information block containing the plurality of UEs' dedicated control information. For example, the control information generation circuitry 940 shown and described above in connection with FIG. 9 may generate the information block, individual CRCs, and group CRC(s).

At block 1508, the scheduling entity may polar encode the information block by jointly polar encoding the full set of dedicated control information for the plurality of UEs, including the individual CRCs and the group CRC(s). For example, the encoder circuitry 942 shown and described above in connection with FIG. 9 may polar encode the information block to produce a polar code block containing the dedicated control information for the plurality of UEs, individual CRCs and group CRC(s).

At block 1510, the scheduling entity may generate an information message including a number of UEs having dedicated control information within the polar code block. In some examples, the information message may include five bits to indicate the number of UEs. For example, the control information generation circuitry 940 shown and described above in connection with FIG. 9 may generate the information message. At block 1512, the scheduling entity may encode the information message to produce an encoded information message. In some examples, the information message may be encoded using a 32-bit Walsh code. For example, the encoder circuitry 942 shown and described above in connection with FIG. 9 may encode the information message.

At block 1514, the scheduling entity may transmit the polar code block and the encoded information message over the air interface. For example, the scheduling entity may utilize the transceiver 910 shown and described above in connection with FIG. 9 to transmit the polar code block and the encoded information message over the air interface.

Joint Polar Decoding Process

Figure 16:
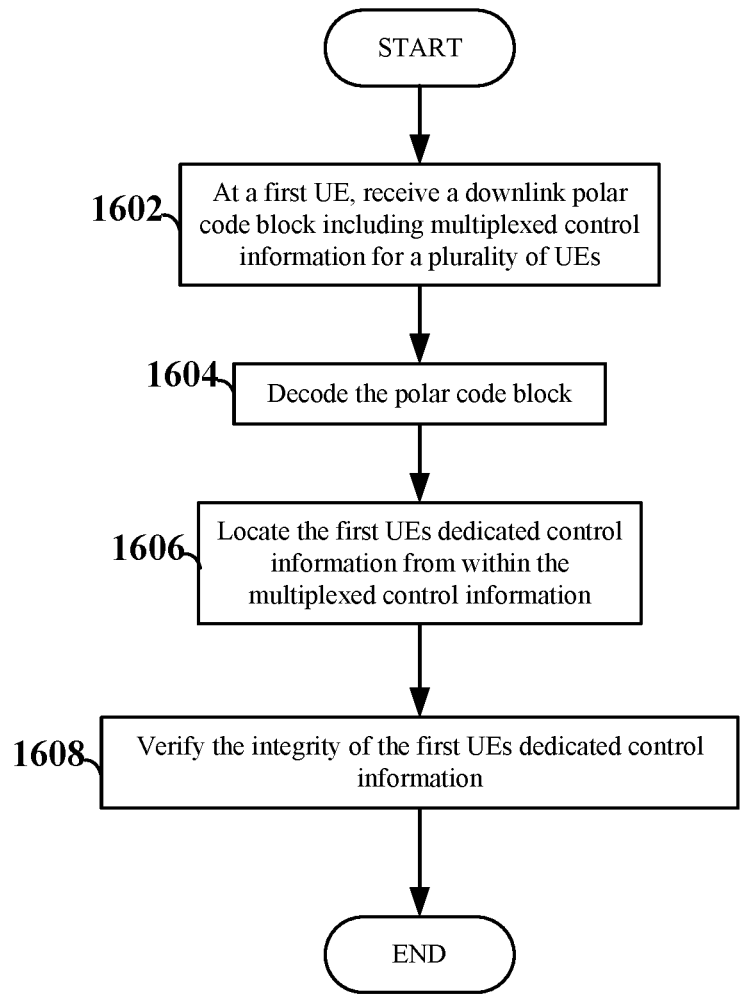
FIG. 16 is a flow chart illustrating an exemplary process for receiving and polar decoding a transmission that includes jointly polar encoded control information corresponding to a plurality of UEs, in accordance with some aspects of the disclosure.

FIG. 16 is a flow chart illustrating an exemplary process 1600 for receiving and polar decoding a transmission that includes jointly polar encoded control data corresponding to a plurality of UEs, in accordance with some aspects of the disclosure. As described below, some or all illustrated features may be omitted in a particular implementation within the scope of the present disclosure, and some illustrated features may not be required for implementation of all embodiments. In some examples, the process 1600 may be carried out by the scheduled entity 1000 illustrated in FIG. 10. In some examples, the process 1600 may be carried out by any suitable apparatus or means for carrying out the functions or algorithm described below. For ease of description, the following discussion refers to a first UE as carrying out the process 1600.

At block 1602, the first UE may receive a downlink transmission including a polar code block containing multiplexed control information for a plurality of UEs, and at block 1604, the first UE may polar decode the polar code block as one block or set of encoded data. For example, the polar decoder circuitry 1040 shown and described above in connection with FIG. 10 may polar decode the polar code block.

At block 1606, the first UE may locate or identify its own dedicated control information from within the multiplexed control information for the plurality of UEs, and at block 1608, the first UE may verify the integrity of the first UEs dedicated control information. For example, the first UE may execute a CRC algorithm based on one set of dedicated control information, and also based on the first UE's own UE-specific identifier (e.g., it's RNTI). If the CRC fails, the first UE may assume that that set of dedicated control information is for a different UE. The first UE may repeat this algorithm, stepping through each set of dedicated control information until it finds dedicated control information having a CRC that matches. Once a CRC check passes on a set of dedicated control information, the first UE may consider that it has identified its own dedicated control information. For example, the control information locating and verification circuitry 1042 shown and described above in connection with FIG. 10 may locate the dedicated control information for the first UE.

Figure 17:
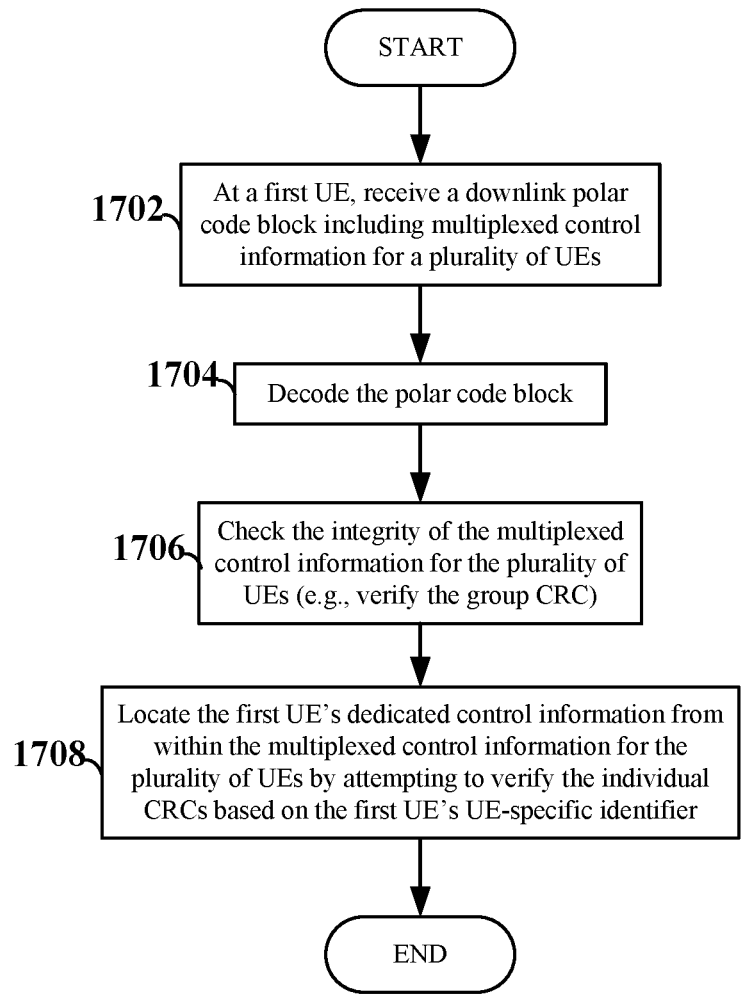
FIG. 17 is a flow chart illustrating another exemplary process for receiving and polar decoding a transmission that includes jointly polar encoded control information corresponding to a plurality of UEs, in accordance with some aspects of the disclosure.

FIG. 17 is a flow chart illustrating another exemplary process 1700 for receiving and polar decoding a transmission that includes jointly polar encoded control data corresponding to a plurality of UEs, in accordance with some aspects of the disclosure. As described below, some or all illustrated features may be omitted in a particular implementation within the scope of the present disclosure, and some illustrated features may not be required for implementation of all embodiments. In some examples, the process 1700 may be carried out by the scheduled entity 1000 illustrated in FIG. 10. In some examples, the process 1700 may be carried out by any suitable apparatus or means for carrying out the functions or algorithm described below. For ease of description, the following discussion refers to a first UE as carrying out the process 1700.

At block 1702, the first UE may receive a downlink transmission including a polar code block containing multiplexed control information for a plurality of UEs, and at block 1704, the first UE may polar decode the polar code block as one block or set of encoded data. For example, the polar decoder circuitry 1040 shown and described above in connection with FIG. 10 may polar decode the polar code block.

At block 1706, the first UE may check the integrity of the decoded control information for the plurality of UEs. For example, the first UE may verify the group CRC by calculating a CRC based on the full set of multiplexed control information. For example, the control information locating and verification circuitry 1042 shown and described above in connection with FIG. 10 may verify the integrity of the decoded control information.

At block 1708, the first UE may locate or identify its own dedicated control information from within the multiplexed control information for the plurality of UEs. For example, the first UE may execute a CRC algorithm based on one set of dedicated control information, and also based on the first UE's own UE-specific identifier (e.g., it's RNTI). If the CRC fails, the first UE may assume that that set of dedicated control information is for a different UE. The first UE may repeat this algorithm, stepping through each set of dedicated control information until it finds dedicated control information having a CRC that matches. Once a CRC check passes on a set of dedicated control information, the first UE may consider that it has identified its own dedicated control information. For example, the control information locating and verification circuitry 1042 shown and described above in connection with FIG. 10 may locate the dedicated control information for the first UE.

Figure 18:
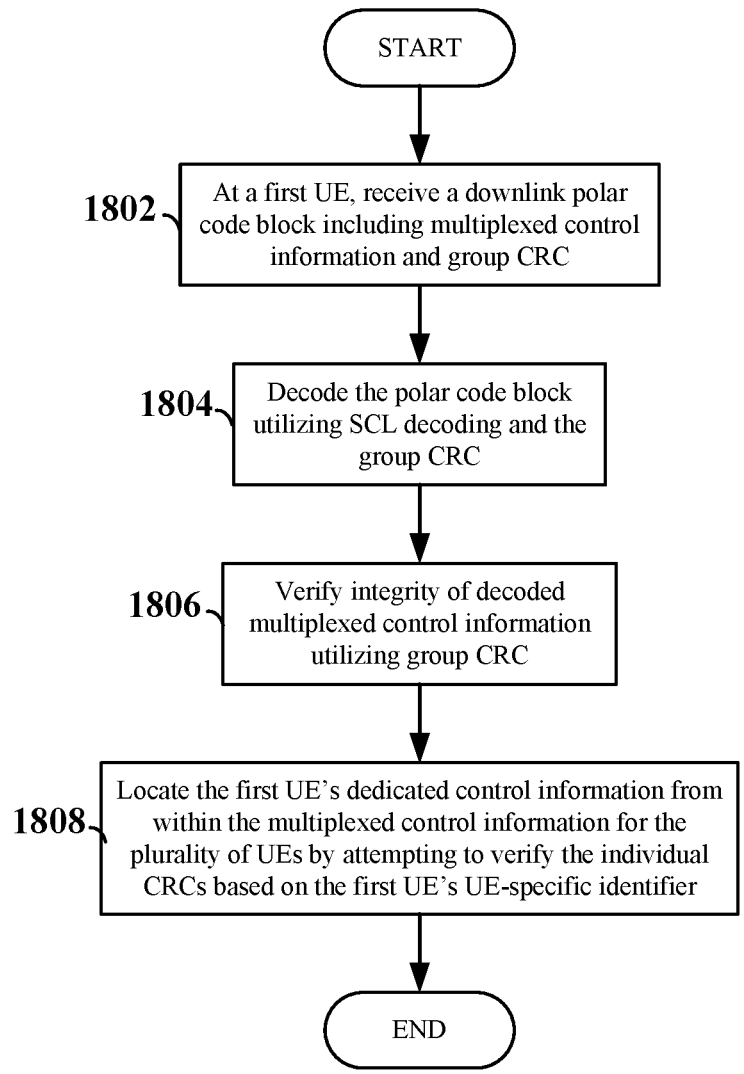
FIG. 18 is a flow chart illustrating another exemplary process for receiving and polar decoding a transmission that includes jointly polar encoded control information corresponding to a plurality of UEs, in accordance with some aspects of the disclosure.

FIG. 18 is a flow chart illustrating another exemplary process 1800 for receiving and polar decoding a transmission that includes jointly polar encoded control data corresponding to a plurality of UEs, in accordance with some aspects of the disclosure. As described below, some or all illustrated features may be omitted in a particular implementation within the scope of the present disclosure, and some illustrated features may not be required for implementation of all embodiments. In some examples, the process 1800 may be carried out by the scheduled entity 1000 illustrated in FIG. 10. In some examples, the process 1800 may be carried out by any suitable apparatus or means for carrying out the functions or algorithm described below. For ease of description, the following discussion refers to a first UE as carrying out the process 1800.

At block 1802, the first UE may receive a downlink transmission including a polar code block containing multiplexed control information for a plurality of UEs and a group CRC. At block 1804, the first UE may polar decode the polar code block utilizing successive-cancellation list (SCL) decoding and the group CRC. For example, the first UE may implement a CA-SCL decoding algorithm in which the group CRC is utilized to test each of the L candidates (e.g., L most likely decoding paths) for errors. If more than one candidate passes the group CRC (e.g., produces a remainder of 0), the first UE may select the most probable candidate among those that pass. For example, the polar decoder circuitry 1040 shown and described above in connection with FIG. 10 may polar decode the polar code block.

At block 1806, the first UE may check the integrity of the decoded control information for the plurality of UEs. For example, the first UE may verify the group CRC by calculating a CRC based on the full set of multiplexed control information. For example, the control information locating and verification circuitry 1042 shown and described above in connection with FIG. 10 may verify the integrity of the decoded control information.

At block 1808, the first UE may locate or identify its own dedicated control information from within the multiplexed control information for the plurality of UEs. For example, the first UE may execute a CRC algorithm based on one set of dedicated control information, and also based on the first UE's own UE-specific identifier (e.g., it's RNTI). If the CRC fails, the first UE may assume that that set of dedicated control information is for a different UE. The first UE may repeat this algorithm, stepping through each set of dedicated control information until it finds dedicated control information having a CRC that matches. Once a CRC check passes on a set of dedicated control information, the first UE may consider that it has identified its own dedicated control information. For example, the control information locating and verification circuitry 1042 shown and described above in connection with FIG. 10 may locate the dedicated control information for the first UE.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-18 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-10 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of wireless communication operable at a scheduled entity, comprising:
   receiving a polar code block comprising multiplexed control information for a plurality of scheduled entities, including the scheduled entity;
   decoding the polar code block utilizing polar decoding;

locating dedicated control information for the scheduled entity from within the multiplexed control information; and verifying an integrity of the dedicated control information.

2. The method of claim 1, further comprising:
verifying an additional integrity of the multiplexed control information.

3. The method of claim 1, wherein decoding the polar code block further comprises:
performing successive-cancellation list decoding of the polar code block.

4. The method of claim 3, wherein the polar code block further comprises group cyclic redundancy check (CRC) information for the multiplexed control information, and wherein the performing the successive-cancellation list decoding further comprises:
utilizing the group CRC information to decode the polar code block.

5. The method of claim 4, wherein the group CRC information comprises one of sixteen bits, twenty-four bits, or thirty-two bits.

6. The method of claim 1, further comprising:
receiving an encoded information message comprising a number of the plurality of scheduled entities associated with the multiplexed control information within the polar code block;
decoding the encoded information message to produce a decoded information message; and
determining a size of the polar code block from the number of the plurality of scheduled entities.

7. The method of claim 6, wherein the decoded information message comprises five bits.

8. The method of claim 1, wherein the multiplexed control information comprises a plurality of dedicated control information, each intended for a respective one of the plurality of scheduled entities, and wherein the locating the dedicated control information for the scheduled entity and the verifying the integrity of the dedicated control information further comprises:
performing a respective cyclic redundancy check (CRC) of each of the plurality of dedicated control information using an identifier of the scheduled entity to locate and verify the dedicated control information for the scheduled entity.

9. The method of claim 1, wherein the multiplexed control information is grouped into a plurality of control information groups in accordance with channel conditions associated with each of the plurality of scheduled entities, and further comprising:
verifying an additional integrity of a control information group of the plurality of control information groups comprising the dedicated control information.

10. An apparatus configured for polar decoding, the apparatus comprising:
a processor;
a memory communicatively coupled to the processor; and
a transceiver communicatively coupled to the processor, wherein the processor and the memory are configured to:
receive a polar code block comprising multiplexed control information for a plurality of scheduled entities, including the apparatus;
decode the polar code block utilizing polar decoding;
locate dedicated control information for the apparatus from within the multiplexed control information; and
verify an integrity of the dedicated control information.

11. The apparatus of claim 10, wherein the processor and the memory are further configured to:
verify an additional integrity of the multiplexed control information.

12. The apparatus of claim 10, wherein the processor and the memory are further configured to:
perform successive-cancellation list decoding of the polar code block.

13. The apparatus of claim 12, wherein the polar code block further comprises group cyclic redundancy check (CRC) information for the multiplexed control information, and wherein the processor is further configured to:
utilize the group CRC information to perform the successive-cancellation list decoding of the polar code block.

14. The apparatus of claim 13, wherein the group CRC information comprises one of sixteen bits, twenty-four bits, or thirty-two bits.

15. The apparatus of claim 10, wherein the processor and the memory are further configured to:
receive an encoded information message comprising a number of the plurality of scheduled entities associated with the multiplexed control information within the polar code block;
decode the encoded information message to produce a decoded information message; and
determine a size of the polar code block from the number of the plurality of scheduled entities.

16. The apparatus of claim 15, wherein the decoded information message comprises five bits.

17. The apparatus of claim 10, wherein the multiplexed control information comprises a plurality of dedicated control information, each intended for a respective one of the plurality of scheduled entities, and wherein the processor and the memory are further configured to:
perform a respective cyclic redundancy check (CRC) of each of the plurality of dedicated control information using an identifier of the apparatus to locate and verify the dedicated control information for the apparatus.

18. The apparatus of claim 10, wherein the multiplexed control information is grouped into a plurality of control information groups in accordance with channel conditions associated with each of the plurality of scheduled entities, and wherein the processor and the memory are further configured to:
verify an additional integrity of a control information group of the plurality of control information groups comprising the dedicated control information.

19. An apparatus configured for polar decoding, the apparatus comprising:
means for receiving a polar code block comprising multiplexed control information for a plurality of scheduled entities, including the apparatus;
means for decoding the polar code block utilizing polar decoding;
means for locating dedicated control information for the apparatus from within the multiplexed control information; and
means for verifying an integrity of the dedicated control information.

20. The apparatus of claim 19, further comprising:
means for verifying an additional integrity of the multiplexed control information.

* * * * *